US012581869B2

(12) United States Patent
Quintero Pérez et al.

(10) Patent No.: US 12,581,869 B2
(45) Date of Patent: Mar. 17, 2026

(54) SIDE-GATED SEMICONDUCTOR-SUPERCONDUCTOR HYBRID DEVICES

(71) Applicant: Microsoft Technology Licensing, LLC, Redmond, WA (US)

(72) Inventors: Marina Quintero Pérez, Delft (NL); David Johannes Van Woerkom, Pijnacker (NL); Vinay Kumar Chinni, Delft (NL); Amrita Singh, Delft (NL)

(73) Assignee: Microsoft Technology Licensing, LLC, Redmond, WA (US)

( * ) Notice: Subject to any disclaimer, the term of this patent is extended or adjusted under 35 U.S.C. 154(b) by 596 days.

(21) Appl. No.: 17/907,530

(22) PCT Filed: Mar. 31, 2020

(86) PCT No.: PCT/EP2020/059172
§ 371 (c)(1),
(2) Date: Sep. 27, 2022

(87) PCT Pub. No.: WO2021/197590
PCT Pub. Date: Oct. 7, 2021

(65) Prior Publication Data
US 2023/0147168 A1     May 11, 2023

(51) Int. Cl.
*H01L 29/06*        (2006.01)
*H10N 60/01*        (2023.01)
(Continued)

(52) U.S. Cl.
CPC ............. *H10N 60/10* (2023.02); *H10N 60/01* (2023.02); *H10N 69/00* (2023.02); *H10N 60/85* (2023.02)

(58) Field of Classification Search
CPC ........ H10N 60/10; H10N 60/01; H10N 69/00; H10N 60/85; H10N 60/128; G06N 10/40; B82Y 10/00
See application file for complete search history.

(56) References Cited

U.S. PATENT DOCUMENTS

| | | | | |
|---|---|---|---|---|
| 4,377,633 | A | * | 3/1983 | Abrahamovich ... H01L 21/0272 |
| | | | | 430/394 |
| 6,051,485 | A | | 4/2000 | Schindler |

(Continued)

FOREIGN PATENT DOCUMENTS

| | | |
|---|---|---|
| CN | 102544009 A | 7/2012 |
| CN | 102664153 A | 9/2012 |

(Continued)

OTHER PUBLICATIONS

"High-κ dielectric", Retrieved from: https://en.wikipedia.org/wiki/High-%CE%BA_dielectric, Jan. 13, 2020, 4 Pages.

(Continued)

*Primary Examiner* — Ismail A Muse
(74) *Attorney, Agent, or Firm* — Alleman Hall & Tuttle LLP

(57) ABSTRACT

One aspect provides semiconductor-superconductor hybrid device comprises a substrate, a first semiconductor component arranged on the substrate, a superconductor component arranged to be capable of energy level hybridisation with the first semiconductor component, and a second semiconductor component arranged as a gate electrode for gating the first semiconductor component. Another aspect provides a semiconductor-superconductor hybrid device, comprising: a substrate; a semiconductor component arranged on the substrate; a gate electrode for gating the semiconductor component; and a superconductor component capable of undergoing energy level hybridisation with the semiconductor component; wherein the gate electrode is arranged in a (Continued)

channel in the substrate. Also provided are methods of fabricating the semiconductor-superconductor hybrid devices.

18 Claims, 8 Drawing Sheets

(51) Int. Cl.
  *H10N 60/10* (2023.01)
  *H10N 69/00* (2023.01)
  *H10N 60/85* (2023.01)

(56) References Cited

U.S. PATENT DOCUMENTS

| | | | |
|---|---|---|---|
| 10,629,798 B1 | 4/2020 | Kallaher et al. | |
| 2006/0038242 A1 | 2/2006 | Hsu | |
| 2008/0102613 A1* | 5/2008 | Elers | C23C 16/50 |
| | | | 438/584 |
| 2010/0090217 A1 | 4/2010 | Akimoto | |
| 2014/0353593 A1* | 12/2014 | Smets | H10D 48/383 |
| | | | 257/39 |
| 2017/0133576 A1 | 5/2017 | Marcus | |
| 2019/0214474 A1* | 7/2019 | Merckling | H10D 62/121 |
| 2019/0288104 A1* | 9/2019 | Kinoshita | H10D 62/822 |
| 2020/0027030 A1 | 1/2020 | Freedman et al. | |
| 2020/0027919 A1 | 1/2020 | Van Hoogdalem et al. | |
| 2020/0027971 A1 | 1/2020 | Freedman et al. | |
| 2020/0185516 A1* | 6/2020 | Reznicek | H10D 30/721 |
| 2020/0227636 A1 | 7/2020 | Krogstrup Jeppesen et al. | |
| 2020/0243742 A1 | 7/2020 | Ramakers et al. | |
| 2021/0126181 A1 | 4/2021 | Winkler et al. | |

FOREIGN PATENT DOCUMENTS

| | | |
|---|---|---|
| CN | 110009107 A | 7/2019 |
| CN | 110176455 A | 8/2019 |
| CN | 110741486 A | 1/2020 |
| EP | 0341148 A2 | 11/1989 |
| EP | 0523279 A1 | 1/1993 |
| EP | 3505490 A1 | 7/2019 |
| JP | S61190990 A | 8/1986 |
| JP | S6433818 A | 2/1989 |
| JP | H01264242 A | 10/1989 |
| JP | H04163975 A | 6/1992 |
| JP | H05152629 A | 6/1993 |
| JP | H09199605 A | 7/1997 |
| JP | H09270538 A | 10/1997 |
| KR | 20160095288 A | 8/2016 |
| KR | 20200019247 A | 2/2020 |
| WO | 2019001753 A1 | 1/2019 |
| WO | 2019099171 A2 | 5/2019 |
| WO | 2021112856 A1 | 6/2021 |

OTHER PUBLICATIONS

"Refractory Metals", Retrieved from: https://en.wikipedia.org/wiki/Refractory_metals, Mar. 10, 2020, 7 Pages.

Aseev, et al., "Selectivity Map for Molecular Beam Epitaxy of Advanced III-V Quantum Nanowire Networks", In Journal of Nano letters, vol. 19, Issue 1, Jan. 9, 2019, pp. 218-227.

Davies, et al., "Selective Area Growth of III-V Semiconductors by Chemical Beam Epitaxy: Study of Reaction Mechanisms", In Proceedings of Epitaxial Growth Processes, SPIE, vol. 2140, May 11, 1994, pp. 58-67.

Fahed, Maria, "Selective Area Growth of In-Plane III-V Nanostructures using Molecular Beam Epitaxy", Thesis Submitted to University of Lille, Nov. 24, 2016, 140 Pages.

Fukui, et al., "GaAs Tetrahedral Quantum Dot Structures Fabricated Using Selective area Metalorganic Chemical Vapor Deposition", In Journal of Applied Physics Letters, vol. 58, Issue 18, May 6, 1991, pp. 2018-2020.

Zhang, et al., "Quantized Majorana Conductance", In Repository of arXiv:1710.10701, Oct. 29, 2017, 26 Pages.

"International Search Report and Written Opinion Issued in PCT Application No. PCT/EP20/059172", Mailed Date: Dec. 23, 2020, 16 Pages.

Winkler, et al., "Unified Numerical Approach to Topological Semi-conductor-Superconductor Heterostructures", In Journal of Physical Review B, vol. 99, Issue 24, Jun. 13, 2019, 14 Pages.

Office Action Received for Chinese Application No. 202080099435. X, mailed on May 16, 2024, 24 pages (English Translation Provided).

Office Action Received for Korean Application No. 10-2022-7030101, mailed on Jul. 10, 2024, 32 pages. (English Translation Provided).

U.S. Appl. No. 12/579,183, filed Oct. 14, 2009.
U.S. Appl. No. 12/556,440, filed Sep. 9, 2009.
U.S. Appl. No. 12/562,940, filed Sep. 18, 2009.
U.S. Appl. No. 14/668,300, filed Mar. 25, 2015.
U.S. Appl. No. 13/321,807, filed Jun. 18, 2010.
U.S. Appl. No. 12/329,517, filed Dec. 5, 2008.
U.S. Appl. No. 12/136,645, filed Jun. 10, 2008.
U.S. Appl. No. 10/829,668, filed Oct. 31, 2002.
U.S. Appl. No. 10/962,295, filed Apr. 8, 2003.
U.S. Appl. No. 12/166,491, filed Jul. 2, 2008.
U.S. Appl. No. 12/166,439, filed Jul. 2, 2008.
U.S. Appl. No. 17/382,174, filed Jul. 21, 2021.
U.S. Appl. No. 16/484,088, filed Oct. 26, 2018.
U.S. Appl. No. 17/018,972, filed Sep. 11, 2020.
U.S. Appl. No. 16/252,230, filed Jan. 18, 2019.
U.S. Appl. No. 17/332,908, filed May 27, 2021.
U.S. Appl. No. 16/258,025, filed Jan. 25, 2019.
U.S. Appl. No. 17/429,300, filed Feb. 15, 2019.
U.S. Appl. No. 17/597,837, filed Jul. 29, 2019.
U.S. Appl. No. 17/753,581, filed Sep. 10, 2019.
U.S. Appl. No. 17/756,036, filed Nov. 15, 2019.
U.S. Appl. No. 17/756,812, filed Dec. 5, 2019.
U.S. Appl. No. 17/906,427, filed Mar. 30, 2020.
U.S. Appl. No. 17/996,369, filed Apr. 22, 2020.
U.S. Appl. No. 17/996,442, filed Apr. 29, 2020.

Notice of Reasons for Refusal Received for Japanese Application No. 2022-553006, mailed on Apr. 23, 2024, 10 pages (English Translation Provided).

Decision of Refusal Received for Japanese Application No. 2022-553006, mailed on Oct. 1, 2024, 6 pages (English Translation Provided).

Notice of Second Office Action Received for Chinese Application No. 202080099435, mailed on Nov. 8, 2024, 33 pages (English Translation Provided).

Rejection Decision Received for Chinese Application No. 202080099435.X, mailed on Mar. 12, 2025, 31 pages. (English Translation Provided).

Communication pursuant to Article 94(3) Received in European Patent Application No. 20717801.3, mailed on Oct. 22, 2025, 10 pages.

Deon, et al., "Proximity effect in a two dimensional electron gas probed with a lateral quantum dot", arXiv:1104.2771v1, Apr. 14, 2011, 05 pages.

Desjardins, et al., "Synthetic spin-orbit interaction for Majorana devices", Nature Materials, vol. 18, 2019, 6 pages.

First Examination Report Received for Indian Application No. 202247051707, mailed on Dec. 22, 2025, 05 pages.

* cited by examiner

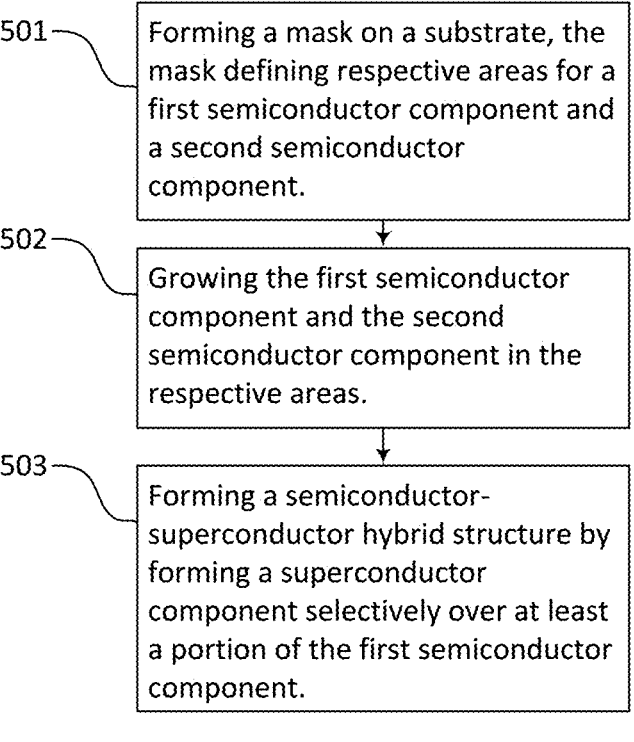

501 — Forming a mask on a substrate, the mask defining respective areas for a first semiconductor component and a second semiconductor component.

502 — Growing the first semiconductor component and the second semiconductor component in the respective areas.

503 — Forming a semiconductor-superconductor hybrid structure by forming a superconductor component selectively over at least a portion of the first semiconductor component.

Fig. 5

601 — Cooling the semiconductor-superconductor hybrid device to a temperature at which the superconductor component is superconductive.

602 — Applying a magnetic field to the semiconductor-superconductor hybrid device.

603 — Applying an electrostatic field to the first semiconductor component by supplying charge to the second semiconductor component.

Fig. 6

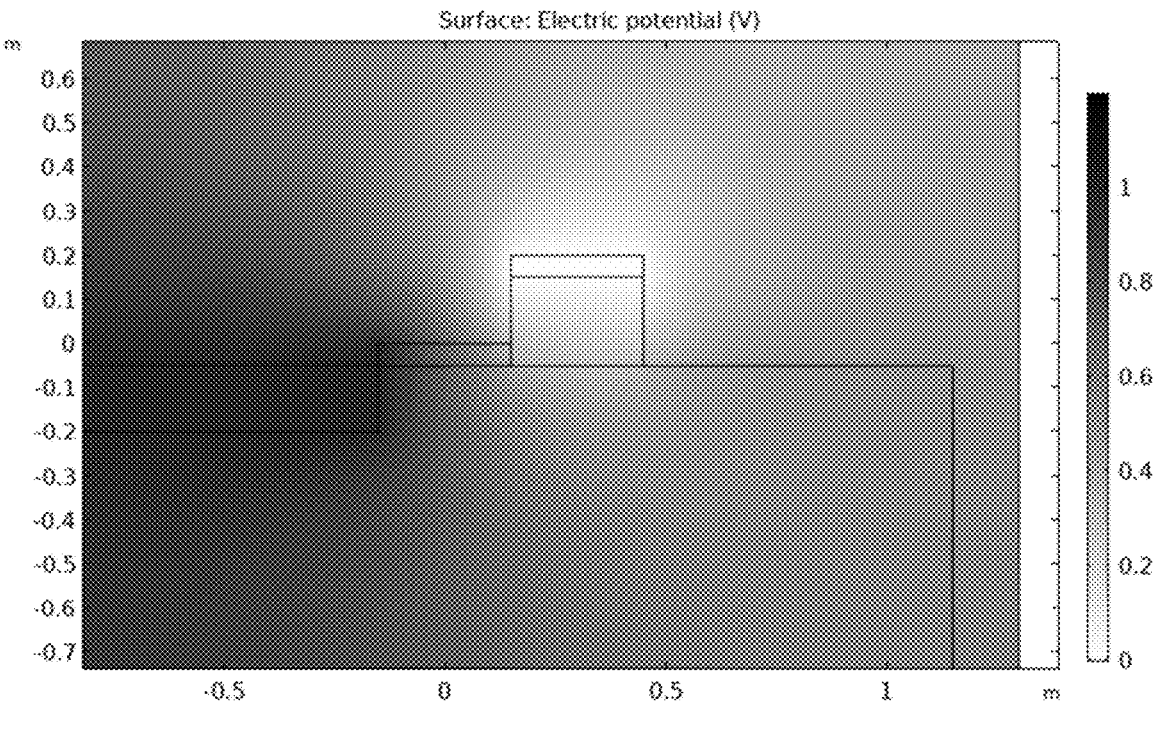

Fig. 9c

1001 ─ Fabricating a gate electrode over a substrate.

1002 ─ Forming a dielectric mask over the substrate, the dielectric mask having an opening, which opening exposes a portion of the substrate.

1003 ─ Fabricating a semiconductor component on the portion of the substrate by selective area growth.

1004 ─ Fabricating a superconductor component over the semiconductor component to form the semiconductor-superconductor hybrid device.

Fig. 10

SIDE-GATED SEMICONDUCTOR-SUPERCONDUCTOR HYBRID DEVICES

CROSS REFERENCE TO RELATED APPLICATIONS

The present application is a U.S. National Phase of International Patent Application Serial No. PCT/EP2020/059172 entitled "SIDE-GATED SEMICONDUCTOR-SUPERCONDUCTOR HYBRID DEVICES", filed Mar. 31, 2020.

BACKGROUND

Topological quantum computing is based on the phenomenon whereby non-abelian anyons, in the form of "*Majorana* zero modes" (MZMs), can be formed in regions where a semiconductor is coupled to a superconductor. A non-abelian anyon is a type of quasiparticle, meaning not a particle per se, but an excitation in an electron liquid that behaves at least partially like a particle. An MZM is a particular bound state of such quasiparticles. Under certain conditions, these states can be formed close to the semiconductor-superconductor interface in a nanowire formed from a length of semiconductor coated with a superconductor. When MZMs are induced in the nanowire, it is said to be in the "topological regime". To induce this requires a magnetic field, conventionally applied externally, and also cooling of the nanowire to a temperature that induces superconducting behaviour in the superconductor material. It may also involve gating a part of the nanowire with an electrostatic potential.

By forming a network of such nanowires and inducing the topological regime in parts of the network, it is possible to create a quantum bit (qubit) which can be manipulated for the purpose of quantum computing. A quantum bit, or qubit, is an element upon which a measurement with two possible outcomes can be performed, but which at any given time (when not being measured) can in fact be in a quantum superposition of the two states corresponding to the different outcomes.

To induce an MZM, the device is cooled to a temperature where the superconductor (e.g. Aluminium, Al) exhibits superconducting behaviour. The superconductor causes a proximity effect in the adjacent semiconductor, whereby a region of the semiconductor near the interface with the superconductor also exhibits superconducting properties. I.e. a topological phase behaviour is induced in the adjacent semiconductor as well as the superconductor. It is in this region of the semiconductor where the MZMs are formed.

Another condition for inducing the topological phase where MZMs can form is the application of a magnetic field in order to lift the spin degeneracy in the semiconductor. Degeneracy in the context of a quantum system refers to the case where different quantum states have the same energy level. Lifting the degeneracy means causing such states to adopt different energy levels. Spin degeneracy refers to the case where different spin states have the same energy level. Spin degeneracy can be lifted by means of a magnetic field, causing an energy level spilt between the differently spin-polarized electrons. This is known as the Zeeman effect. Typically, the magnetic field is applied by an external electromagnet. However, U.S. Ser. No. 16/246,287 has also disclosed a heterostructure in which a layer of a ferromagnetic insulator is disposed between the superconductor and semiconductor in order to internally apply the magnetic field for lifting the spin degeneracy, without the need for an external magnet. Examples given for the ferromagnetic insulator included compounds of heavy elements in the form of EuS, GdN, $Y_3Fe_5O_{12}$, $Bi_3Fe_5O_{12}$, $YFeO_3$, $Fe_2O_3$, $Fe_3O_4$, GdN, $Sr_2CrReO_6$, $CrBr_3/Crl_3$, $YTiO_3$ (the heavy elements being Europium, Gadolinium, Yttrium, Iron, Strontium and Rhenium).

Inducing MZMs typically also requires gating the nanowire with an electrostatic potential. The electrostatic potential is applied using a gate electrode. Applying an electrostatic potential manipulates the number of charge carriers in the conductance band or valence band of the semiconductor component.

SUMMARY

In one aspect, there is provided a semiconductor-superconductor hybrid device comprising: a substrate; a first semiconductor component arranged on the substrate; a superconductor component arranged to be capable of energy level hybridisation with the first semiconductor component; and a second semiconductor component arranged as a gate electrode for gating the first semiconductor component. Another aspect provides a method of fabricating the semiconductor-superconductor hybrid device. A still further aspect provides a use of a semiconductor component as a gate electrode for gating a further semiconductor component in a semiconductor-superconductor hybrid device. By using a semiconductor component as a gate electrode, the gate electrode and semiconductor component of the hybrid structure may be fabricated in a single step. This may make it easier to position the gate electrode and semiconductor component relative to one another.

One aspect provides a semiconductor-superconductor hybrid device comprising: a substrate; a semiconductor component arranged on the substrate; a gate electrode for gating the semiconductor component; and a superconductor component capable of undergoing energy level hybridisation with the semiconductor component; wherein the gate electrode is arranged in a channel in the substrate. Another aspect provides a method of fabricating the semiconductor-superconductor hybrid device. By arranging the gate electrode in a channel in the substrate, the substrate may act as a gate dielectric. This may allow for improved gating efficiency, since a substrate material will have a higher dielectric constant than a vacuum.

Still another aspect provides a method of fabricating a semiconductor-superconductor hybrid device, which method comprises: fabricating a gate electrode over a substrate; forming a dielectric mask over the substrate, the dielectric mask having an opening, which opening exposes a portion of the substrate; fabricating a semiconductor component on the portion of the substrate by selective area growth; and fabricating a superconductor component over the semiconductor component to form the semiconductor-superconductor hybrid device; wherein the gate electrode is fabricated before the semiconductor component; and wherein the gate electrode comprises a gate material selected to avoid interference with the selective area growth.

Another aspect provides a semiconductor-superconductor hybrid device, comprising: a substrate; a semiconductor component arranged on the substrate; a superconductor component arranged to be capable of energy level hybridisation with the semiconductor component; a gate electrode for gating the semiconductor component; and a gate dielectric arranged between the gate electrode and the semiconductor component; wherein a bottom part of the gate electrode is spaced laterally from a bottom part of the semiconductor component; and wherein a top part of the semiconductor component overhangs at least a portion of the gate electrode.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Nor is the claimed subject matter limited to implementations that solve any or all of the disadvantages noted herein.

BRIEF DESCRIPTION OF THE DRAWINGS

To assist understanding of embodiments of the present disclosure and to show how such embodiments may be put into effect, reference is made, by way of example only, to the accompanying drawings in which:

FIG. 5 is a flow chart outlining an illustrative method of fabricating a semiconductor-superconductor hybrid device of the type shown in FIGS. 3 and 4;

FIG. 6 is a flow chart outlining an illustrative method of operating a semiconductor-superconductor hybrid device of the type shown in FIGS. 3 and 4;

FIGS. 9(a) to 9(c) are heat maps showing electrostatic potential as a function of position in three different semiconductor-superconductor hybrid devices;

FIG. 10 is a flow chart outlining an illustrative method of fabricating a gate electrode for a semiconductor-superconductor hybrid device;

DETAILED DESCRIPTION OF EMBODIMENTS

Figure 1:
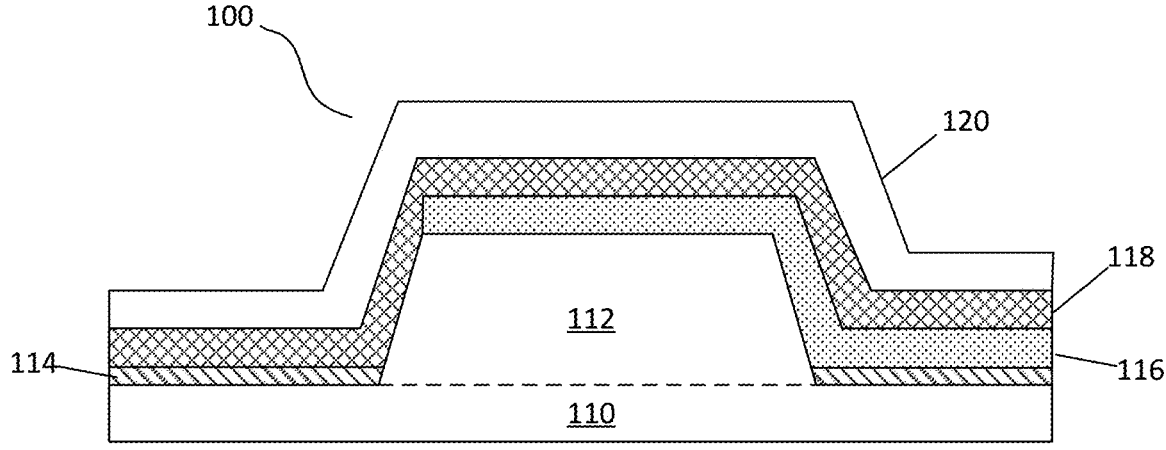
FIG. 1 is a schematic cross-section of a top-gated semiconductor-superconductor hybrid device according to a comparative example.

As used herein, the verb 'to comprise' is used as shorthand for 'to include or to consist of'. In other words, although the verb 'to comprise' is intended to be an open term, the replacement of this term with the closed term 'to consist of' is explicitly contemplated, particularly where used in connection with chemical compositions.

Directional terms such as "top", "bottom", "left", "right", "above", "below", "horizontal" and "vertical" are used herein for convenience of description and relate to the orientation shown in FIGS. 1 to 3, 7 and 11. For the avoidance of any doubt, this terminology is not intended to limit the orientation of the device in an external frame of reference.

As used herein, the term "superconductor" refers to a material which becomes superconductive when cooled to a temperature below a critical temperature, Tc, of the material. The use of this term is not intended to limit the temperature of the device.

A "nanowire" is an elongate member having a nano-scale width, and a length-to-width ratio of at least 100, or at least 500, or at least 1000. A typical example of a nanowire has a width in the range 10 to 500 nm, optionally 50 to 100 nm or 75 to 125 nm. Lengths are typically of the order of micrometres, e.g. at least 1 μm, or at least 10 μm.

The term "coupling" in the context of the present disclosure refers to the hybridisation of energy levels.

A "semiconductor-superconductor hybrid structure" comprises a semiconductor component and a superconductor component which are capable of coupling to one another under certain operating conditions. In particular, this term refers to a structure capable of showing topological behaviour such as *Majorana* zero modes, or other excitations useful for quantum computing applications. The operating conditions generally comprise cooling the structure to a temperature below the $T_c$ of the superconductor component, applying a magnetic field to the structure, and applying electrostatic gating to the structure. Generally, at least part of the semiconductor component is in intimate contact with the superconductor component, for example the superconductor component may be epitaxially grown on the semiconductor component. Certain device structures having one or more further components, such as a ferromagnetic insulator component or a barrier component for controlling a degree of coupling, between the semiconductor component and superconductor component have however been proposed.

All melting points reported herein are measured at a pressure of 1 atm (101 kPa), unless otherwise stated.

Unless otherwise stated, relative permittivity ε is measured at a temperature of 25° C., a frequency of 1 kHz and where applicable at atmospheric pressure (1 atm, 101 kPa).

The content of all documents cited herein is hereby incorporated by reference in its entirety.

The inventors have observed that existing approaches to the gating of semiconductor-superconductor hybrid devices have various drawbacks. These drawbacks will be explained with reference to FIGS. 1 and 2.

FIG. 1 is a schematic cross-section of a top-gated semiconductor-superconductor hybrid device 100.

The device 100 includes a substrate, a semiconductor-superconductor hybrid structure, and a gating structure. It is to be appreciated that the discussion of the substrate and semiconductor-superconductor hybrid structure is applicable to all of the devices described herein.

Device 100 includes a substrate 110. The substrate provides a base on which further components are fabricated, and may comprise a wafer of a crystalline material. Examples of materials useful as wafers include indium phosphide, gallium arsenide, and gallium antimonide. Although these illustrative materials are semiconductor materials, they have high band gaps. Any semiconducting properties of the substrate are not used in the context of a semiconductor-superconductor hybrid device.

The semiconductor-superconductor hybrid structure comprises a semiconductor component 112 and a superconductor component 116.

The semiconductor component 112 is arranged on the substrate 110. The semiconductor component typically comprises a nanowire, or network of nanowires. A network of nanowires comprises two or more nanowires, and may have a branched structure in plan. The semiconductor component 112 may be grown epitaxially on the substrate 110, for example using selective area growth.

The illustrated semiconductor component 112 has a generally trapezoidal cross-section. The cross-sectional shape is however not particularly limited and may vary depending on, for example, the process and conditions chosen for fabricating the semiconductor component.

Selective area growth uses a dielectric mask 114 arranged on the substrate 110 to control the location at which the semiconductor component 112 grows. The dielectric mask 114 may remain in the finished device, as shown in FIG. 1. Examples of materials useful as dielectric masks include silicon oxides, $SiO_x$, silicon nitrites, $SiN_x$, aluminium oxides, $AlO_x$, and hafnium oxides, $HfO_x$. Two or more dielectric layers may be present.

The semiconductor component 112 may comprise a III-V semiconductor material, for example a material of Formula 1:

$$InAs_xSb_{1-x} \qquad \text{(Formula 1)}$$

where x is in the range 0 to 1. In other words, the semiconductor component 112 may comprise indium antimonide (x=0), indium arsenide (x=1), or a ternary mixture comprising 50% indium on a molar basis and variable proportions of arsenic and antimony (0<x<1).

Another class of materials useful as the semiconductor component are II-VI semiconductor materials. Examples of II-VI semiconductor materials include lead telluride and tin telluride.

The superconductor component 116 is arranged on the semiconductor component 112. The semiconductor component 112 and superconductor component 116 are configured to allow coupling of the semiconductor component 112 and superconductor component 116. Such coupling allows excitations useful for quantum computing to be induced under certain conditions. Typically, the superconductor component 116 is in direct contact with the semiconductor component 112. For example, superconductor component 116 may be grown epitaxially on the semiconductor component 112. However, direct contact is not necessarily essential to achieve coupling. Device structures in which a further component, such as a ferromagnetic insulator, may be arranged between the semiconductor component 112 and superconductor component 116 have been proposed.

The nature of the superconductor is not particularly limited and may be selected as appropriate. The superconductor is typically an s-wave superconductor. Any of the various s-wave superconductors known the art may be used. Examples include aluminium, indium, tin, and lead, with aluminium being preferred in some contexts. In implementations where aluminium is used, the superconductor component 116 may for example have a thickness in the range 4 to 10 nm. Aluminium layers having thicknesses in this range have been reported to couple particularly well to semiconductor materials of Formula 1 (Winkler et al (Physical Review B 99, 245408 (2019)).

The device 100 may include one or more regions where no superconductor component is present on the semiconductor component 112. In other words, superconductor component 116 does not necessarily extend along the full length of the semiconductor component 112.

The gating structure of the device 100 will now be described. Device 100 is top-gated, with gating being provided by a gate electrode 120 which is arranged over the other components of the device 100. The purpose of gate electrodes in general is to apply an electrostatic field to the semiconductor component 112 during use, in order to manipulate the number of charge carriers in the conduction band or valence band of the semiconductor component 112.

In examples where the superconductor component 116 does not extend along the full length of the semiconductor component 112, gating may be applied to any portion of the semiconductor component 112 as desired. A gate electrode for gating a region of the semiconductor component where the superconductor component is present may be referred to as a plunger gate. Gate electrode 120 as illustrated in FIG. 1 is a plunger gate. A gate electrode for gating a region of the semiconductor component where the superconductor component is not present may be referred to as a cutter gate. A device may include a combination of plunger and cutter gates.

Flow of current between a gate electrode and another component is referred to as leakage current. A gating structure typically includes a gate dielectric for preventing or reducing leakage current. In a top-gated device, such as device 100, a layer of dielectric material 118 must be provided between the gate-electrode 120 and the remaining components of the device 100 in order to avoid a short circuit. Leakage current in such a device may depend on various factors including quality, e.g. purity and thickness, of the layer of dielectric material 118.

Semiconductor-superconductor hybrid devices have been found to be susceptible to damage by exposure to elevated temperatures. This applies to the finished device, as well as to various workpieces obtained at the various stages of fabrication. The maximum temperature to which a device or workpiece may be exposed without damage is referred to as its thermal budget. The choice of materials is one factor which may influence thermal budget. The thermal budget may change as fabrication progresses. For example, thermal budget is generally not a limiting factor at stages before the semiconductor component is fabricated, whereas after forming the semiconductor-superconductor interface the thermal budget may be restricted. For example, in a semiconductor-superconductor hybrid device which uses InSb as the semiconductor material and aluminium as the superconductor material, thermal budget may be limited to 40° C. or even less after fabricating the interface.

The inventors have found that the requirement for a layer of dielectric material 118 creates difficulties. Arranging components on a substrate forms a step shape, and it is difficult to form a dielectric layer having a consistent thickness over such a shape. Forming a high-quality dielectric layer on semiconductor-superconductor hybrid structure is challenging due to thermal budget limitations. It has been found that the semiconductor-superconductor interface degrades over time, and the rate of degradation increases with temperature. Any so-called post fabrication steps, i.e. steps performed after fabricating the interface must be performed at a low temperature (e.g., 40° C. or below, or 25° C. or below) to avoid destroying the hybrid structure.

Processes for forming a dielectric at low temperature, for example, the sputtering of materials such as silicon nitrides, $SiN_x$, form poorer quality dielectrics than processes conducted at higher temperature, such as atomic layer deposition. Problems such as leakage current at lower voltages, hysteresis, and trapped charges may be observed when using dielectrics formed by low-temperature processes.

A still further drawback observed by the inventors is that arranging any component over the semiconductor-superconductor interface applies mechanical strain to that interface due to intrinsic stresses in the material layer. Such mechanical stresses also tend to degrade the interface. The mechanical stress can also change the band structure at the semiconductor-superconductor interface, which may change the behaviour of the device in unpredictable ways.

Another consideration is that the superconductor component may screen the semiconductor component from the electrostatic field when using a top-gated arrangement. In other words, the superconductor component may block the electrostatic field from reaching the semiconductor component.

Figure 2:
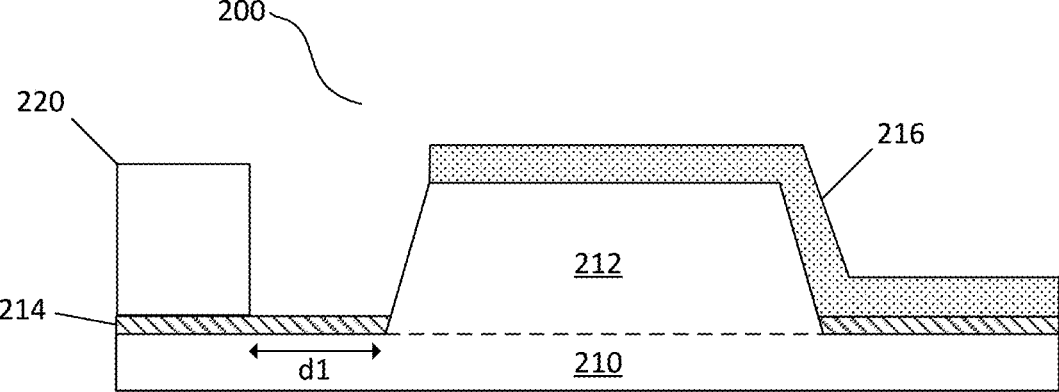
FIG. 2 is a schematic cross-section of a side-gated semiconductor-superconductor hybrid device according to a comparative example.

As an alternative to top-gating, side-gating has been proposed. FIG. 2 shows a schematic diagram of a comparative side-gated device 200.

The side-gated device 200 of FIG. 2 includes a substrate 210; a semiconductor-superconductor hybrid structure comprising a semiconductor component 212 and superconductor component 216; and a dielectric mask 114. These may each be as previously described with reference to the top-gated device 100.

The side-gated device 200 differs from the top-gated device 100 in that the gate electrode 220 is spaced laterally from the semiconductor component 212, as opposed to being arranged above the semiconductor component. In this arrangement, a gap of distance d1 between the gate electrode 220 and semiconductor component 212 serves as the gate dielectric, thereby avoiding the need for an additional layer of dielectric material as in the top-gated device.

Although the side-gated configuration of the comparative example avoids some of the drawbacks associated with top-gating, challenges remain. Empty space has a very low dielectric constant. Semiconductor-superconductor hybrid devices are typically operated in a vacuum, which by definition has a relative permittivity ER of 1. High gate voltages are therefore needed in order to gate the hybrid device. It has also been found that it is difficult to position the gate electrode accurately during manufacture, since alignment along 2 axes in the plane of the substrate is required. As a result, a gap of at least 50 nm must be left between the gate electrode 220 and the active portion of the semiconductor-superconductor hybrid device. Such a gap further reduces gating efficiency.

Provided herein are side-gated semiconductor-superconductor hybrid devices which may address one or more of the drawbacks of the earlier approaches.

Figure 3:
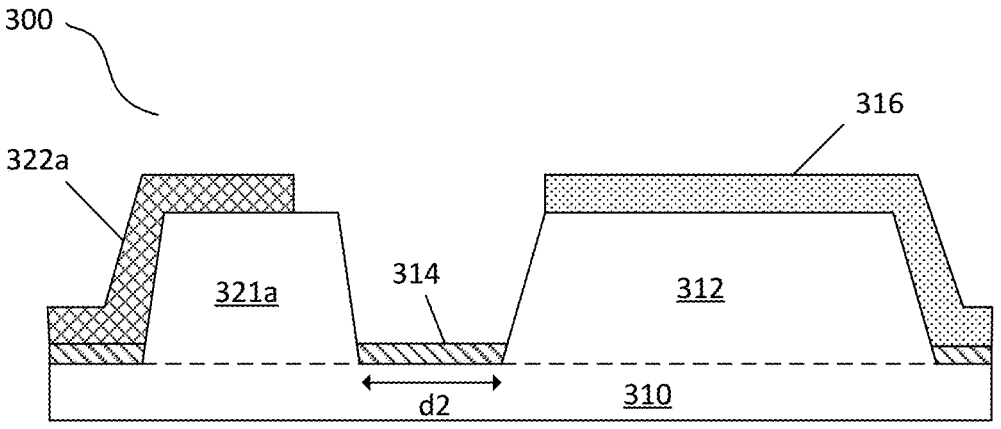
FIG. 3 is a schematic cross-section of a first example of a side-gated semiconductor-superconductor hybrid device according to the present disclosure.
Figure 4:
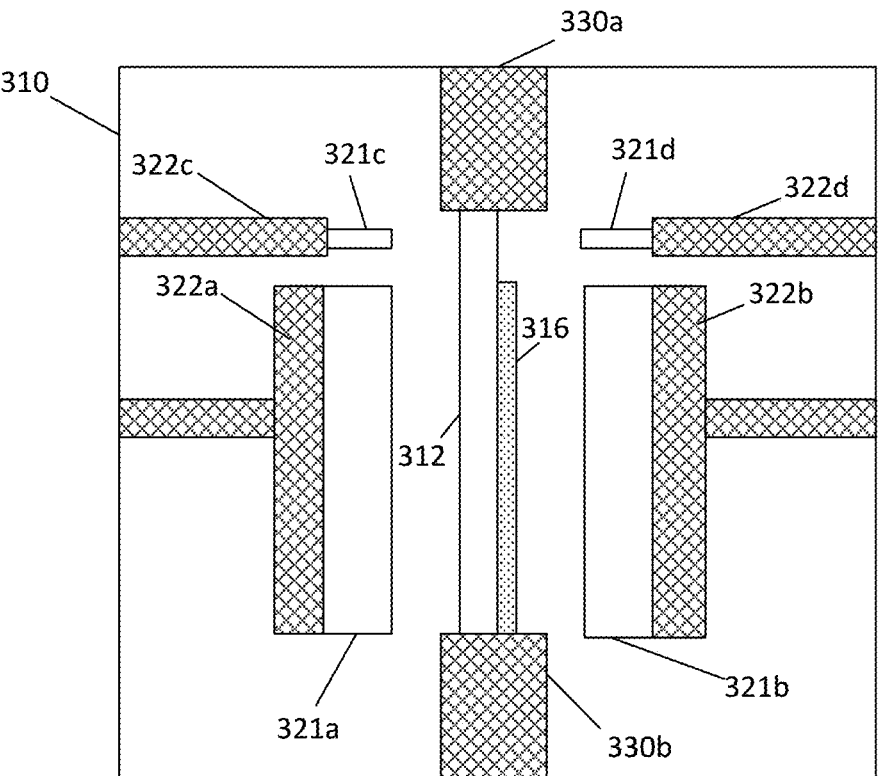
FIG. 4 is a schematic plan view of the semiconductor-superconductor hybrid device of FIG. 3.

A first example of a semiconductor-superconductor hybrid device 300 according to the present disclosure will now be described with reference to FIGS. 3 and 4. FIG. 3 shows a schematic cross-section of the device, and FIG. 4 shows a schematic plan view. The device of this example is a superconductor-nanowire-normal contact tunnel junction, also referred to as an SIN or S-NW-N junction. The principles explained herein are applicable to other types of semiconductor-superconductor hybrid devices.

The device 300 includes a substrate 310 and a semiconductor-superconductor hybrid structure comprising a semiconductor component 312 and a superconductor component 316. The semiconductor-superconductor hybrid structure is as previously described with reference to FIG. 1. A layer of a dielectric mask 314 is arranged on the substrate 310.

Device 300 further comprises gate electrodes 321. FIG. 3 shows one of the gate electrodes 321a. The gate electrode 321a is in the form of a semiconductor component which is arranged on the surface of the substrate 310.

Gate electrode 321a is grown epitaxially on the substrate surface 310, using the same dielectric mask 314 as is used to control growth of the semiconductor component 312. The gate electrode 321a and semiconductor component 312 may thus be grown simultaneously, in a single fabrication step. The relative positions of the semiconductor component 312 and gate electrode 321a may thus be defined accurately during fabrication.

Gate electrode 321a is spaced from the semiconductor component 312 by a distance d2. Distance d2 is measured at the surface of the substrate 310. In order to maximise the strength of the electrostatic field which may be applied to the semiconductor components 312a at a given voltage, the distance d2 is desirably as small as possible without allowing the semiconductor component 312 for the hybrid structure and the semiconductor component 321a for the gate electrode to merge together during growth. Distance d2 may be, for example, at least 30 nm or at least 50 nm. These distances provide a relatively large margin, and smaller distances could be used.

In practice, edges of components grown by selective area growth may overhang the edges of the mask by a small amount. Provided that the semiconductor component 312 for the hybrid structure and the semiconductor component 321a for the gate electrode do not come into contact with one another and create a short-circuit, such an overhang may be advantageous. The overhang reduces the effective distance between the semiconductor component 312 for the hybrid structure and the semiconductor component 321a for the gate electrode, thereby improving gate efficiency.

The space between the gate electrode 321a and the semiconductor component 312 serves as the gate dielectric. In other words, the space prevents flow of electrical current between the gate electrode 321a and the semiconductor 312.

The portion of dielectric mask 314 between the gate electrode 321a and the semiconductor component 312 also functions as part of the gate dielectric. The thickness of dielectric mask 314 may be in the range 10 to 30 nm, for example, 15 to 20 nm. The semiconductor component 312 and gate electrode 321a may have heights in the range 80 to 100 nm. 10 to 30% of the height of the semiconductor component 312 and gate electrode 321a may be embedded in the dielectric mask 314.

As previously described, dielectric mask 314 may comprise a silicon oxide or a silicon nitride. Silicon oxide has a ER of approximately 3.7, and so is a better dielectric than a vacuum. As will be explained in the discussion of FIG. 9b, embedding the gate electrode in the mask may increase gating efficiency.

FIG. 3 further shows an electrical connector 322a connected to the gate electrode 32a1. The structure of the electrical connector 322a is not particularly limited. The electrical connector 322a may comprise a metal which is not superconductive under the operating conditions of the device 300, for example, gold. Alternatively, a superconductor material may be used.

By applying an electric charge to the gate electrode 321a via electrical connector 322a, gate electrode 321a may be made to behave like a metal, and may thus be used to apply an electrostatic field to the semiconductor component 312a of the hybrid structure, i.e. to gate the semiconductor component 312a. Any degree of electrical contact between the connector 322a and gate electrode 321a may allow for this behaviour. In contrast to devices where a metal component serves directly as a gate electrode, precise positioning of the connector 322a relative to the semiconductor-superconductor hybrid structure is not required in order to achieve gating because gate electrode 321a is already positioned precisely on the substrate.

In a quantum computer device, connectors 330a, 330b as shown in FIG. 4 are attached to respective ends of the hybrid structure. The function of connectors 330a, 330b is to allow current and voltage to be applied to the hybrid structure, in order to allow measurement of properties of the hybrid structure. Such measurement may allow a quantum bit to be read, for example. Electrical connector 322a for the electrode may be formed at the same time as the connectors 330a, 320b for the hybrid structure.

Electrical connectors, also referred to as contacts, are typically formed from a normal-conductor, e.g. a metal such as gold.

In the FIG. 4 device, superconductor component 316 is in contact with one of the connectors 330b. The superconductor component 316 does not extend along the full length of the semiconductor component 312, and is spaced from the other of the connectors 330a. The device thus includes a nanowire-normal contact junction, between semiconductor component 312 and connector 330a.

FIG. 4 further shows that more than one gate electrode may be provided. The present example includes a pair of plunger gates 321a, 321b, one on either side of the region of the semiconductor component 312 which is provided with superconductor component 316. In use, the plunger gates act to vary the chemical potential of the hybrid structure in the gated region.

The device further includes a pair of tunnel gates 321c, 321d. The tunnel gates 321c, 321d are arranged on either side of the nanowire-normal contact junction. In use, the tunnel gates 321c, 321d may be used to modify the ability of electrons to pass through the nanowire-normal contact junction. This may be referred to as the "transparency" of the junction.

Arranging gate electrodes in pairs may allow for more effective gating of the semiconductor component, since an electrostatic field may be applied to the semiconductor material from both sides.

Each gate electrode 321a, 321b, 321c, 321d is connected to a respective electrical connector 322a, 322b, 322c, 322d.

Various modifications may be made to the device shown in FIGS. 3 and 4.

The example shows only one possible layout of gate electrodes relative to the semiconductor and superconductor components. Other layouts may be used. Many implementations of semiconductor-superconductor hybrid devices include at least one plunger gate and at least one tunnel gate.

In one variant, one or more gate electrode(s) may be formed in a channel or trench in the substrate. This may allow the substrate to serve as gate dielectric.

Another possibility is to apply a further layer of a dielectric material over the device and at least partially filling the space between the semiconductor component and gate electrode, similar to the dielectric layer 118 shown in FIG. 1. This may improve gating efficiency in comparison with variants where an empty space serves as dielectric, since dielectric materials have higher permittivity than a vacuum.

A method of fabricating a semiconductor-superconductor hybrid device of the type described with reference to FIGS. 3 and 4 will now be explained with reference to FIG. 5. FIG. 5 is a flowchart outlining the method.

At block 501, a mask is formed on a substrate 310, the mask defining respective areas for the first semiconductor component 312 for the hybrid structure and the second semiconductor component 321 for the gate electrode. The mask exposes areas on the substrate 310 where the first semiconductor component 312 and the second semiconductor component 321 are to be grown.

One illustrative example of a technique for forming a mask is electron beam lithography. This involves applying a resist to the substrate, selectively exposing areas of the resist to an electron beam, and then developing the resist to form the mask.

The resist may be a positive resist. This may reduce exposure time.

Since block 501 occurs before the semiconductor components are fabricated, and more particularly before the delicate semiconductor-superconductor hybrid structure is formed, the methods which may be chosen for applying the resist and/or treating the mask are not particularly limited. For example, techniques such as plasma enhanced chemical vapour deposition and/or baking at temperatures of 250° C. or greater may be used. Such techniques may be effective for reducing the concentration of impurities and may yield a high-quality dielectric mask.

The mask may comprise silicon oxide or silicon nitride, for example. The mask may have a thickness in the range 15 to 20 nm.

At block 502, the first semiconductor component and the second semiconductor component are grown in the respective areas. The respective areas are selected such that the second semiconductor component is arranged as a gate electrode for gating the first semiconductor component.

Techniques for growing crystalline components selectively using a mask have been described, for example in G. J Davies Proc. SPIE 2140, Epitaxial Growth Processes, 58 (doi:10.1117/12.175795) M Fahed, Doctoral thesis: Selective area growth of in-plane III-V nanostructures using molecular beam epitaxy, 2016 (http://www.theses.fr/2016LIL10114); Fukui et al, Appl. Phys. Lett. 58, 2018 (1991) (doi: 10.1063/1.105026); P. Aseev et al. Nano Letters 2019 19 (1), 218-227, doi: 10.1021/acs.nanolett.8b03733.

At block 503, a semiconductor-superconductor hybrid structure is formed by forming a superconductor component selectively over at least a portion of the first semiconductor component. This may comprise selectively depositing superconductor material over the first semiconductor component. Alternatively, a blanket coating of superconductor material could be applied and then subsequently patterned. Typically, selectively depositing the superconductor component is preferred because this may avoid a need to expose the device to an etchant.

For example, deposition of superconductor material may be controlled by using a directional deposition technique such as molecular beam epitaxy in combination with shadow walls provided over the substrate. A shadow wall is a structure which is configured to block a beam of material during directional deposition from a selected direction, thereby defining a shadow region in which the material is not deposited. Shadow wall structures have been described in, for example, WO2019/099171 A2; U.S. Ser. No. 16/246,289; U.S. Ser. No. 16/258,025; and PCT/US2019/064705.

Shadow walls may be fabricated at any appropriate stage of the process, depending upon the structure of the shadow wall.

In examples where the shadow wall is constructed from a semiconductor material, the shadow wall be fabricated simultaneously with the first and second semiconductor components at block 502, by providing openings in the mask formed at block 501 in appropriate locations.

In examples where the shadow walls are fabricated from a dielectric material, the shadow walls may be fabricated before block 501, between block 501 and 502, or between block 502 and 503 as appropriate. It may be preferable to fabricate the shadow walls before block 502, to minimise the number of process steps after fabricating the semiconductor components.

Fabricating the superconductor component directly after growing the first and second semiconductor components, with no intervening steps, may be preferred. For example, the semiconductor components and superconductor component may be fabricated in the same vacuum chamber without releasing the vacuum. This may allow for a cleaner interface between the first semiconductor component and the super-conductor component.

After block 503, the device is preferably maintained at low temperature, for example below 0° C. or below –20° C. Maintaining the device at a low temperature may inhibit degradation of the semiconductor-superconductor hybrid structure. It has been observed that certain semiconductor materials may react with certain superconductor materials, and that the rate of reaction increases with temperature.

The method may further comprise, after block 503, form-ing electrical connectors 330a, 330b for the semiconductor-superconductor hybrid structure, and forming an electrical connector 322a for the second semiconductor component, i.e. gate electrode, 321a. Illustrative methods for forming these components include sputtering and evaporation.

In examples where a further dielectric layer over the device is desired, this may be formed after block 503, and after forming the electrical connector 322a. The dielectric layer is typically formed at a temperature less than or equal to 25° C., for example, by sputtering.

Since the present method allows the position of the gate electrode to be defined as part of a selective area growth process simultaneously with the fabrication of the semicon-ductor component of the hybrid structure, difficulties asso-ciated with aligning metal gate electrodes with the hybrid structure observed for comparative side-gated structures may be avoided.

A method of operating a semiconductor-superconductor hybrid device of the type shown in FIGS. 3 and 4 will now be explained with reference to FIG. 6. FIG. 6 is a flowchart outlining the method.

At block 601, the semiconductor-superconductor hybrid device is cooled to a temperature at which the superconduc-tor component is superconductive. In other words, the device is cooled to a temperature below the critical tem-perature $T_c$ of the superconductor component. By way of illustration, an aluminium component may have a critical temperature in the region of 1 K.

At block 602, a magnetic field is applied to the semicon-ductor-superconductor hybrid device. The magnetic field lifts spin degeneracy in the device.

At block 603, an electrostatic field is applied to the first semiconductor component by supplying charge to the sec-ond semiconductor component.

Under the above conditions, excitations such as *Majorana* zero modes may be induced in the device. These excitations may be used to encode a quantum bit, for example. As will be appreciated, intrinsic properties of semiconductor and superconductor materials such as spin-orbit interactions, also contribute to forming the excitations.

A second example of a semiconductor-superconductor hybrid device 700 according to the present disclosure will now be explained with reference to FIG. 7.

Device 700 is arranged on a substrate 710 and includes a semiconductor-superconductor hybrid structure comprising semiconductor component 712 and superconductor compo-nent 716. These elements may be as previously described with reference to the FIGS. 1 to 4 devices.

Gating for the device 700 is provided by a gate electrode 721. The gate electrode 721 is arranged in a channel or trench in the substrate 710. The channel is spaced laterally from the semiconductor component 712.

Gate electrode 721 may comprise a metal, for example, gold. Gate electrode 721 is typically configured to behave as a normal conductor during operation of the device, however in variants the gate electrode 721 may be superconductive. Examples of superconductor materials which may be suit-able for use as gate electrodes include tantalum and alu-minium.

Alternatively, gate electrode 721 may comprise a material selected from platinum, a refractory metal, alloys thereof, and compounds thereof. An example of a suitable alloy is an alloy comprising niobium and titanium. Examples of suit-able compounds include titanium nitride, and niobium tita-nium nitride. As discussed in more detail below with refer-ence to a further aspect, the use of these materials may allow the gate electrode to be fabricated before the semiconductor component without interfering with growth of the semicon-ductor component.

In examples where a metal gate electrode is used, an adhesion layer comprising a material selected from titanium and chromium may be arranged between the substrate 710 and the gate electrode 721. An adhesion layer may in particular be present in examples where the gate electrode comprises gold. The adhesion layer may allow the gate electrode 721 to be formed more easily.

In a variant, the gate electrode 721 may comprise a semiconductor component in contact with an electrical con-nector. For example, a semiconductor component compris-ing a material of Formula 1 may be formed in the channel, and at least a portion of a top surface of this semiconductor component may be in contact with an electrical connector. As previously explained with reference to FIGS. 3 and 4, the use of a semiconductor component as a gate electrode may have various advantages.

When the gate electrode 721 is embedded in the substrate 710, the substrate 710 may act as a gate dielectric. The substrate 710 typically comprises a single crystalline mate-rial e.g. indium phosphide or gallium arsenide, with a high relative permittivity, ER, e.g. an ER in the range 12.5 to 13. This may improve gating efficiency.

In the illustrated example, the top surface of the gate electrode 721 is aligned with a top surface of the substrate 710 to form a substantially planar surface. It may be desirable to avoid introducing morphology when fabricating the gate electrode 721. In other words, it may be desirable to form a workpiece having a substantially planar surface after fabricating the gate electrode 721. A substantially planar surface may be planar to within a tolerance of ±5 nm, preferably ±1 nm. This may make the formation of any subsequent components easier.

Alternatively, gate electrode 721 may protrude from the top surface of the substrate 710. This may provide further gating, in the manner described with reference to gate electrode 321 of the FIG. 3 example.

Device 700 further comprises a dielectric mask 714 provided on a top surface of the substrate 710. Dielectric mask 714 is similar to the dielectric masks of the other devices described above. In the illustrated example, a top part of gate electrode 721 extends up from the top surface of the substrate 710, and the dielectric mask layer 714 sur-rounds the top part of the gate electrode 721. Consequently, in use, both the substrate 710 and the dielectric mask layer 714 function as gate dielectrics between the gate electrode 721 and the semiconductor 712 for transmitting electrostatic field lines whilst preventing flow of leakage current.

Dielectric mask layer 714 extends over the top surface of the gate electrode 721. This may allow a superconductor component to be fabricated over the gate electrode 721, with the dielectric mask 714 preventing a short circuit between the gate electrode and the superconductor component. Since dielectric mask 714 may be formed before fabricating the semiconductor-superconductor hybrid structure, the dielectric mask 714 may be a high-quality dielectric, e.g. obtainable by processing the dielectric using plasma enhanced chemical vapour deposition or baking at temperatures in excess of 250° C.

In variants where the gate electrode protrudes from the top surface of the substrate, the top surface of the gate electrode may be aligned with the top surface of the dielectric mask layer 714 to provide a substantially planar surface.

By allowing the gate electrode 721 to be buried under a superconductor component, further device topologies may be made possible. In a side-gated device of the type shown in FIG. 2, if a superconductor component is arranged between the gate electrode and the semiconductor component then gating efficiency is poor because the superconductor component screens the semiconductor component from the electrostatic field. In contrast, when the gate electrode is buried, electric field lines may pass through the substrate thereby reducing the magnitude of any screening effect.

Figure 7:
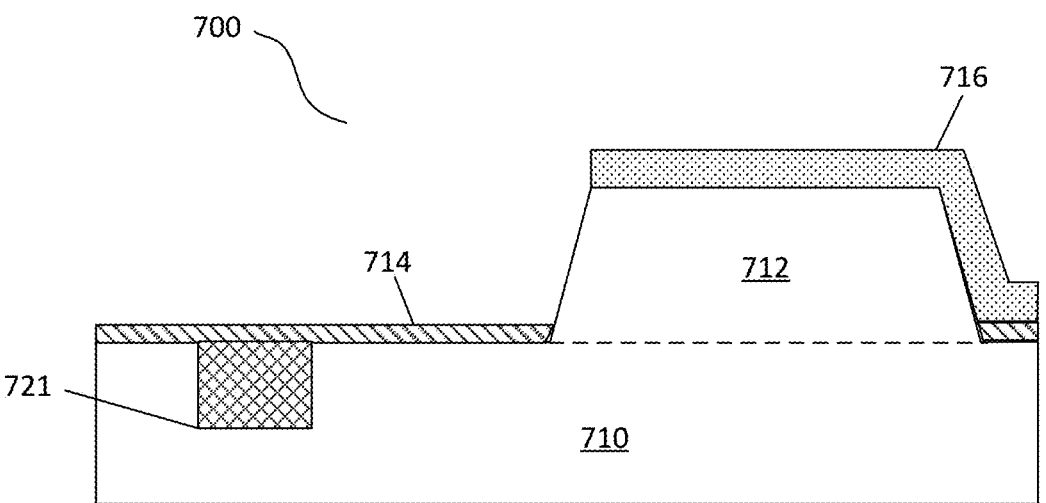
FIG. 7 is a schematic cross-section of a second example of a side-gated semiconductor-superconductor hybrid device according to the present disclosure.
Figure 8:
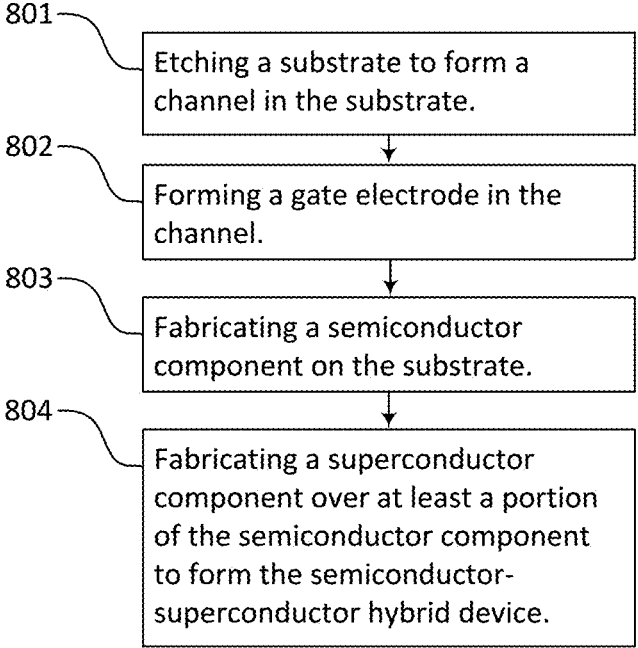
FIG. 8 is a flow chart outlining an illustrative method of fabricating a semiconductor-superconductor hybrid device of the type shown in FIG. 7.

FIG. 8 is a flow chart outlining an illustrative method for fabricating a semiconductor-superconductor hybrid device of the type shown in FIG. 7.

At block 801, a substrate is etched to form a channel in the substrate. The etching is selective and may comprise using a mask to control the areas of the substrate which are etched.

The etching may be dry etching, for example using reactive ion etching. Dry etching processes may allow for better resolution than wet etching processes, because wet etchants have a greater tendency to underrun the mask or, in other words, to etch underneath the edges of the mask.

At block 802, a gate electrode is formed in the channel. This operation may comprise a metallisation step. A directional deposition process, such as an evaporation process, may be used.

Another possibility is to use sputtering. A mask may be used to control the deposition of the gate electrode material. The mask may be a "soft" mask, comprising a polymer such as poly(methyl methacrylic acid) or a copolymer of a styrene and a haloacrylate, e.g. poly(α-methylstyrene-co-methyl chloroacrylate), commercially available under the trade name "CSAR".

In implementations where the gate electrode is formed before growing the semiconductor component, the gate electrode may comprise a material selected from platinum, a refractory metal, alloys thereof, and compounds thereof. Such materials have a low tendency to diffuse across the substrate, which may avoid interference with selective area growth.

At block 803, a semiconductor component is formed on the substrate. This may comprise selective area growth of the semiconductor component. In examples where a metal gate electrode is used, the dielectric mask typically covers the gate electrode. The presence of exposed metal may be detrimental for certain growth processes.

At block 804, a superconductor component is fabricated over at least a portion of the semiconductor component. This may comprise directional deposition of the superconductor material. The directional deposition may be controlled using shadow walls, as previously described with reference to the process of FIG. 5.

The method may comprise further operations as necessary depending on the desired structure of the semiconductor-superconductor hybrid device. For example, when the device is to include a ferromagnetic insulator component, this may be fabricated between blocks 803 and 804.

After fabricating the semiconductor-superconductor device, various post-fabrication steps such as providing electrical connectors for the gate electrode and semiconductor-superconductor hybrid structure may be performed.

The order of operations of the method is not limited to that shown in the figure. The operations may be performed in any suitable order. Certain operations may be performed simultaneously.

For example, in variants where the gate electrode comprises a semiconductor material, blocks 802 and 803 may represent a single process step. In other words, the gate electrode and semiconductor component may be grown simultaneously, for example as part of the same selective area growth process, as described with reference to FIG. 5.

In variants where the gate electrode comprises a superconductor material, blocks 802 and 804 may be combined. In other words, the gate electrode may be formed at the same time as forming the superconductor component on the semiconductor component.

The operations of block 801 may be performed before or after those of block 803. The operations of block 802 may be performed before or after those of block 803. In an example, the method may comprise performing the operations of block 801, then 803, then 802 and 804. This allows the fabrication of the semiconductor component to be performed in the absence of a metal electrode. This may be desirable in implementations where a material with a melting point of less than 1500° C., such as gold, is to be used as the gate electrode.

A further example method of fabricating a semiconductor-superconductor hybrid device will now be explained with reference to FIGS. 10 and 11. FIG. 10 is a flow chart outlining general stages of the method. FIGS. 11(a) to 11(e) are schematic cross-sections of workpieces obtained during an example implementation of method.

Although these examples are described with reference to a single gate electrode, two or more gate electrodes may be fabricated. For example, two gate electrodes may be arranged on either side of the semiconductor component, as previously described. The gate electrode(s) may be any type or combination of gate electrodes. For example, the gate electrodes may include any number or combination of plunger gates, cutter gates, and tunnel gates. A semiconductor-superconductor hybrid device may include a combination of plunger and cutter gates.

According to the present method, a side-gate is fabricated before fabricating the semiconductor component of the semiconductor-superconductor hybrid device. This was previously considered to be impractical, because it was believed that gate materials such as metals would interfere with processes for forming semiconductor components, such as selective area growth. It has however surprisingly been found that, by selecting the gate material appropriately, it is made possible to fabricate the gate electrode before the semiconductor component without such interference. This may allow the processing steps required after fabrication of the semiconductor component to be minimised.

At block 1001, a gate electrode is fabricated over a substrate. The gate electrode the gate electrode comprises a gate material selected to avoid interference with subsequent selective area growth of a semiconductor component.

The substrate may be as previously described with reference to the FIG. 1 device. The gate electrode may be fabricated directly on the substrate. Alternatively, a layer of a dielectric may be arranged between the gate electrode and the substrate. The substrate may include a trench or channel, and the gate electrode may be fabricated in the trench or channel as described with reference to FIGS. 7 and 8.

Typically, the gate electrode is fabricated by lift-off. A lift-off process involves forming a patterned mask on a substrate. At least one layer of material is formed over both the mask and areas left exposed by the mask. The mask is then removed, thereby also removing the material formed over the mask, without removing material from the exposed areas. One of skill in the art will be familiar with lift-off processes.

The lift-off process may include forming two or more layers of material sequentially. For example, a tie layer of a first material may be deposited before depositing a layer of the gate material. The tie layer may serve to improve adhesion of the gate material to the substrate.

Selective etching using an appropriate mask may be used as an alternative to lift-off. The etching may be wet etching or dry etching. Lift-off may be preferred because lift-off may be easier than etching in implementations where the gate electrode comprises platinum or a refractory metal.

The inventors have found that by selecting a gate material with a high enough melting point, interference with selective area growth processes may be avoided. Without wishing to be bound by theory, it is believed that diffusion of metal atoms across the surface of the substrate may interfere with selective area growth. Materials with a high melting point will have a lesser tendency to diffuse across the surface.

Suitable gate materials include materials having a melting point greater than or equal to 1500° C. The gate material may comprise a metal or metal alloy. The metal may comprise platinum or a refractory metal. Conductive compounds such as TiN or NbTiN may also be used.

At block 1002, a dielectric mask is formed over the substrate. The dielectric mask has an opening which exposes a portion of the substrate. The dielectric mask is used subsequently in the process, as a mask for selective area growth of the semiconductor component of the semiconductor-superconductor hybrid device. The semiconductor component will be grown in the opening in a later step.

Forming the mask may comprise depositing a layer of a dielectric material and then etching the layer of dielectric material selectively to form the opening.

The operations of blocks 1001 and 1002 may be combined and may be performed in any appropriate order as desired. For example, a layer of dielectric material may be deposited, then the gate electrode may be fabricated on the layer of dielectric material, and then the opening may be etched. Another possibility is to deposit the layer of dielectric material, etch the layer of dielectric material selectively to form an opening for the gate electrode, fabricate the gate electrode, and then etch the layer of dielectric material selectively to form the opening for selective area growth.

More than one dielectric layer may be formed. For example, a first dielectric layer may be formed before fabricating the gate electrode, and a second dielectric layer may be formed after fabricating the gate electrode so as to cover the gate electrode. The materials of the first and second dielectric layers may be the same or different. The first dielectric layer may comprise a silicon oxide or silicon nitride, and the second dielectric layer may comprise a high-K material.

Covering the gate electrode with a dielectric layer may encapsulate the gate electrode, which may reduce or prevent interference with the subsequent selective area growth of the semiconductor component. Dielectric material arranged over the gate electrode may also act as part of a gate dielectric in the finished device.

At block 1003, a semiconductor component is fabricated on the exposed portion of the substrate by selective area growth. In other words, a semiconductor component is grown epitaxially on the substrate, with the position of the semiconductor component being controlled by the dielectric mask. The material of the semiconductor material may be as described previously with reference to FIG. 1.

In the present method, the semiconductor component is fabricated after fabricating the gate electrode.

As will be described below with reference to FIG. 11, an upper part of the semiconductor component may extend beyond the edges of the opening. This may allow part of the semiconductor component to overhang the gate electrode, with the dielectric mask acting as a gate dielectric. The overhang may provide a side-gated device which also has some bottom-gating.

At block 1004, a superconductor component is fabricated over the semiconductor component to form the semiconductor-superconductor hybrid device. The superconductor component may be as previously described with reference to FIG. 1. The fabrication may comprise a directional deposition process, such as that described with reference to FIG. 5. The gate electrode may itself act as a shadow wall for controlling the directional deposition process.

One advantage of the present method is that it is not necessary to fabricate a gate electrode after forming the delicate semiconductor-superconductor hybrid interface.

An example implementation of the FIG. 10 method will now be described with reference to FIGS. 11(a) to 11(e).

Figure 11A:
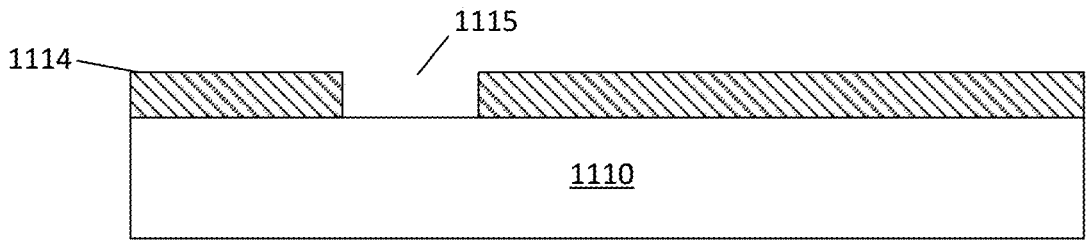
FIGS. 11(a) to 11(e) are schematic cross-sections of workpieces obtained at various stages of the method according to FIG. 10.

A first dielectric layer 1114 is deposited on a substrate 1110. The first dielectric layer may, for example, comprise a silicon oxide or silicon nitride. The first dielectric layer 1114 is etched selectively to form an opening 1115 in the dielectric layer, which opening exposes a portion of the substrate. This yields a workpiece as shown in FIG. 11(a).

Figure 11B:
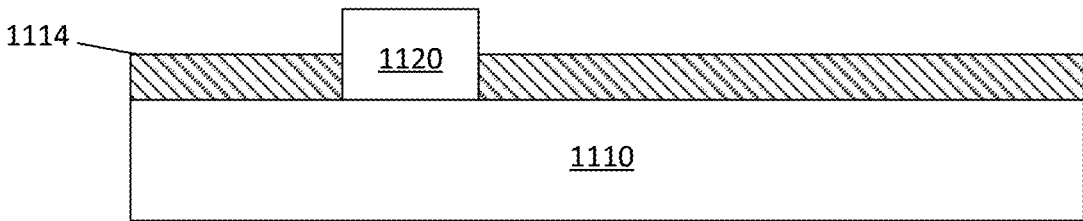

Subsequently, a gate electrode 1120 is fabricated in opening 1115 using a lift-off process, in order to obtain a workpiece as illustrated in FIG. 11(b). The gate electrode comprises a material selected from platinum, a refractory metal, and alloys and compounds thereof.

Figure 11C:
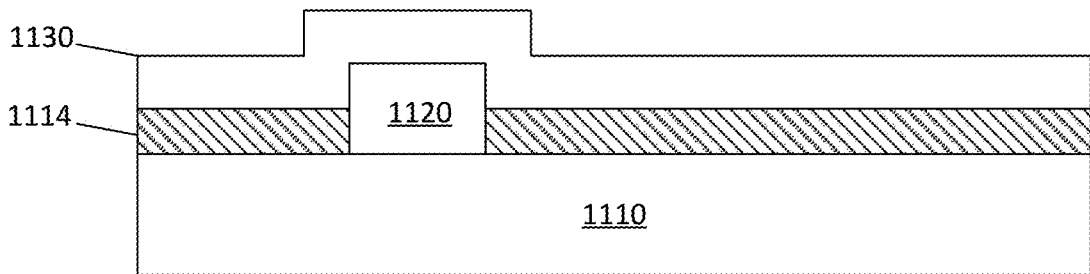
Figure 11D:
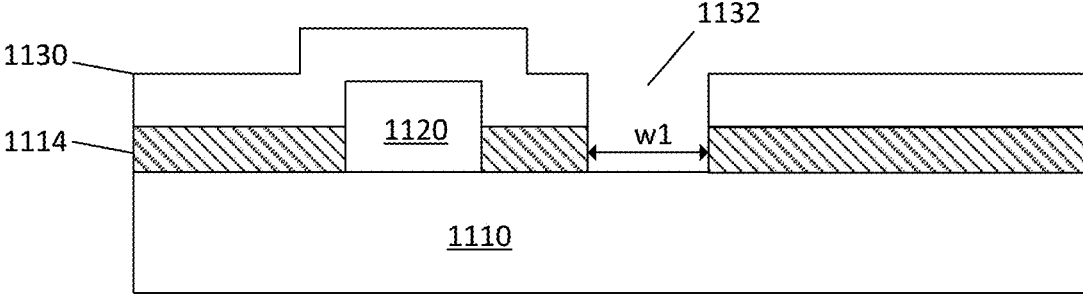
Figure 11E:
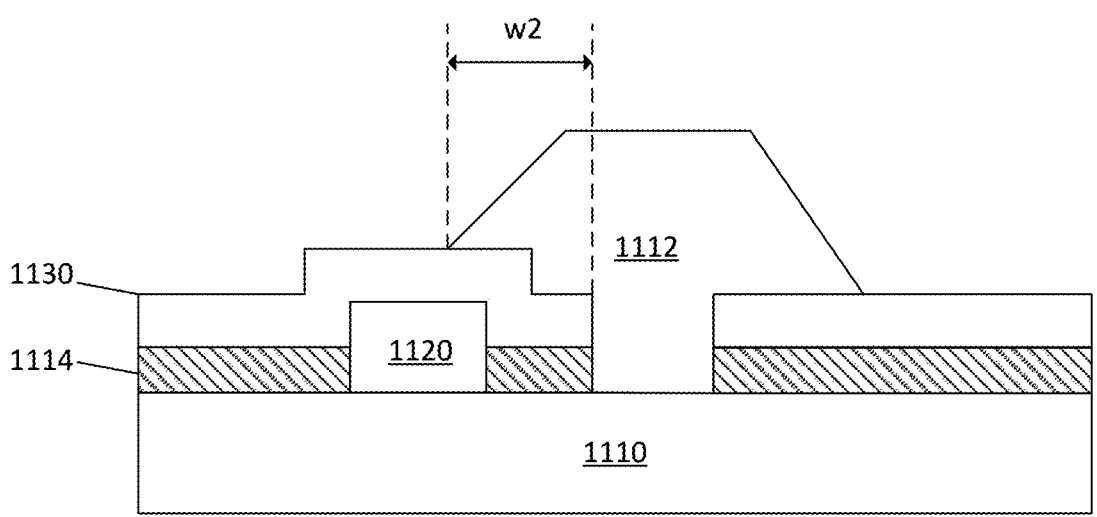

After forming the gate electrode 1120, a second dielectric layer 1130 is formed over the gate electrode 1120 and the first dielectric layer 1114, as is illustrated in FIG. 11(c).

In this example, the first dielectric layer 1114 and second dielectric layer 1130 will act as the gate dielectric for the gate electrode 1120. The second dielectric layer 1130 desirably comprises a high-K dielectric such as aluminium oxide, hafnium oxide, and mixtures thereof.

The second dielectric layer 1130 covers the gate electrode 1120. Encapsulating the gate electrode 1120 in this manner may further reduce any interference on subsequent selective area growth processes.

Since both the first dielectric layer 1114 and second dielectric layer 1130 are formed before fabricating the semiconductor component, the techniques which may be used to form the dielectric layers are not particularly restricted. Examples of techniques useful for forming the dielectric layer include plasma-enhanced chemical vapour deposition, physical vapour deposition, chemical vapour deposition, low-pressure chemical vapour deposition, inductively coupled plasma chemical vapour deposition, and atomic layer deposition. These techniques are referred to herein as "high-temperature techniques". As previously described, these techniques may allow the formation of high-quality dielectric.

After forming the second dielectric layer 1114, the first dielectric layer 1114 and second dielectric layer 1130 are both etched selectively to form an opening 1132 as illustrated in FIG. 11(*d*). The opening 1132 exposes a portion of the substrate 1110. A semiconductor component will be grown in the opening 1132 in a subsequent step. In this way, first dielectric layer 1114 and second dielectric layer 1130 together serve as a dielectric mask for controlling selective area growth of the semiconductor component.

Various methods for creating openings in dielectric layers have been described. In particular, a mask may be formed over the workpiece using a lithography process, and the opening may be etched. The lithography process may be electron beam lithography. The etching may be wet etching.

In a lithographic process, a resist is exposed and developed to form a lithography mask. This mask is then used to control the etching, before being stripped away.

Exposure processes have a finite resolution. For example, when using electron beam lithography, an area which is spaced from the gate electrode by at least 50 nm as measured in the plane of the substrate is targeted. This prevents the opening 1132 from impinging on the gate electrode 1120.

A wet etch will remove some material beyond the edges of the mask. This effect may be referred to as "over-etching". The extent of the over-etch may be up to 30 nm, and is typically 20 to 30 nm. By way of illustration, if a lithography mask with an opening having a width of 100 nm is used in a wet etch, then the resulting opening in the dielectric layers may have a width d in the range 120 to 130 nm.

Therefore, by using a wet etch, the edge of opening 1132 may be closer to the gate electrode than the edge of the region which is exposed during the lithography.

In the illustrated example, both the first and second dielectric layers 1114, 1130 are depicted as being etched to the same extent. This is not necessarily the case. The first and second dielectric layers 1114, 1130 may comprise different materials and so may be etched to different extents.

After etching the first and second dielectric layers 1114, 1130 a semiconductor component 1112 is grown in the opening 1132 using selective area growth. This yields a workpiece as illustrated in FIG. 11(*e*).

In a selective area growth process, the grown component may grow over the edges of the opening in the mask. The area where growth occurs is initially controlled by position of the opening in the dielectric mask. However, once the height of the component exceeds the thickness of the dielectric mask, the component may begin to grow outwardly over the surface of the mask. The resulting component may have a mushroom shape in cross-section, as is illustrated in FIG. 11(*e*).

The extent to which the component overgrows the mask, illustrated as distance w2 in FIG. 11(*e*), may vary depending on the growth conditions and material chosen. This distance may be, for example, up to about 20 nm.

An upper part of the semiconductor component 1112 may therefore overhang the dielectric mask 1114, 1130, and may also overhang the gate electrode 1120. In such a device, the dielectric mask 1114, 1130 will serve as a gate dielectric for preventing flow of current between the gate electrode 1120 and semiconductor component 1112. Since the dielectric mask 1114, 1130 is fabricated before the semiconductor component 1112 using high-temperature techniques, the dielectric mask 1114, 1130 may be of good quality compared to dielectrics formed after fabricating the semiconductor component.

The present configuration may allow the overall distance between the gate electrode 1120 and semiconductor component 1112 to be reduced. This may increase gating efficiency.

In implementations where an upper part of the semiconductor component 1112 overhangs the gate electrode 1120, the device will have both side-gated and bottom-gated character. The effective surface area of the semiconductor component 1112 which faces the gate electrode 1120 may be increased, thereby increasing gating efficiency.

It will be appreciated that the above embodiments have been described by way of example only.

More generally, according to one aspect disclosed herein, there is provided a semiconductor-superconductor hybrid device comprising: a substrate; a first semiconductor component arranged on the substrate; a superconductor component arranged to be capable of energy level hybridisation with the first semiconductor component; and a second semiconductor component arranged as a gate electrode for gating the first semiconductor component. Since the gate electrode is formed from a semiconductor, the gate electrode may be fabricated at the same time as the semiconductor component which couples to the superconductor component. This may allow for better alignment of the gate electrode.

The second semiconductor component is typically spaced laterally form the first semiconductor component. The distance between the first and second semiconductor components may be, for example, at least 50 nm. Smaller distances may be used provided that the first and second semiconductor components do not come into contact with one another.

The first semiconductor component is typically arranged on a surface of the substrate. The second semiconductor component may also be arranged on the surface. Alternatively, the semiconductor-superconductor hybrid device may further comprise a channel formed in the substrate, and at least a portion of the second semiconductor component may be arranged in the channel. By arranging the gate electrode in a channel, the substrate may act as a gate dielectric. This may allow for the use of lower gate voltages, because a substrate material will have greater permittivity than that of a vacuum.

The semiconductor-superconductor hybrid device may further comprise a dielectric mask arranged on the substrate. The dielectric mask may comprise silicon oxide or silicon nitride, for example. At least a portion of the dielectric mask may be arranged between the first semiconductor component and the second semiconductor component. The fabrication of the device may involve the use of a dielectric mask, which may remain in the finished device. The dielectric mask may act as part of a gate dielectric for the gate electrode.

The semiconductor superconductor hybrid device may further comprise a layer of dielectric over the first semiconductor component, the second semiconductor component, and the superconductor component. In particular, the layer of dielectric material may be useful in arrangements where the first and second semiconductor components are each arranged on the surface of the substrate. A vacuum has a very low dielectric constant, and providing a dielectric material may allow the use of lower gate voltages.

The device may include two second semiconductor components, arranged to respective sides of the first semiconductor component. Providing more than one gate electrode may improve the effectiveness of the gating.

The device may further comprise an electrical connector in electrical contact with the second semiconductor component. The electrical connector may comprise a normal conductor such as gold.

Another aspect provides a method of fabricating a semiconductor-superconductor hybrid device, e.g. the semiconductor-superconductor hybrid device as defined above, which method comprises: forming a mask on a substrate, the mask defining respective areas for a first semiconductor component and a second semiconductor component; growing the first semiconductor component and the second semiconductor component simultaneously in the respective areas; and forming a semiconductor-superconductor hybrid structure by forming a superconductor component selectively over at least a portion of the first semiconductor component; wherein the respective areas are selected such that the second semiconductor component is arranged as a gate electrode for gating the first semiconductor component.

Since the gate electrode and first semiconductor component are formed by growth on the substrate in a single step, the gate electrode may be positioned with a high level of precision relative to the first semiconductor component. Fabrication of the device may be simplified, because no separate step for forming a gate electrode is necessary.

The respective areas may be spaced from one another by a distance of at least 30 nm, optionally at least 50 nm. This may prevent the first and second semiconductor components from merging during growth. Smaller distances may be used.

Since the mask is formed before fabricating the semiconductor component, processes involving the use of elevated temperature may be used at this stage without restriction. For example, forming the mask may include forming a dielectric layer, and then selectively etching the dielectric layer to form the mask. Examples of methods useful for forming the dielectric layer include plasma-enhanced chemical vapour deposition, physical vapour deposition, chemical vapour deposition, low-pressure chemical vapour deposition, inductively coupled plasma chemical vapour deposition, and atomic layer deposition.

Forming the mask may include baking a resist at a temperature greater than or equal to 200° C., for example, a temperature greater than or equal to 350° C. Baking may improve adhesion of the resist to the substrate. Baking may remove impurities from the resist, thereby improving the dielectric properties of the mask.

Examples of resists include hydrogen silsesquioxane and poly(acrylates) such as poly(methyl methacrylic acid). These resists are useful for electron beam lithography. The mask may be formed by selectively exposing portions of the resist to an electron beam, and developing the resist using a developer.

Superconductor material may be deposited over at least a portion of the second semiconductor component, provided that no short-circuit between the first semiconductor component and second semiconductor component is formed. Since the second semiconductor component is made to behave like a metal during operation, the presence of metal on the second semiconductor component may be tolerated, or even advantageous in certain implementations.

In alternative implementations, superconductor material is not deposited over any portion of the second semiconductor component.

The method may further comprise, before the depositing, forming a shadow wall over the substrate. Depositing the superconductor component may comprise directionally depositing superconductor material from a direction selected such that the shadow wall defines a shadow region in which the superconductor material is not deposited. Shadow walls are useful for controlling the deposition of material by directional deposition techniques. Such techniques may, for example, avoid the use of chemical etching to pattern the superconductor component.

The shadow wall may be formed before growing the first semiconductor component and the second semiconductor component in the respective areas. Certain shadow walls may be formed from dielectric materials. Forming the shadow walls before growing the semiconductor allows for the use of high temperature processes such as baking or PECVD. Further, it may be desirable to minimise the amount of processing which takes place after fabricating the semiconductor component.

Alternatively, the shadow wall may be formed at the same time as the first and second semiconductor components. Shadow walls formed from semiconductors have been described in U.S. Ser. No. 16/246,289. This may allow for control over deposition of the superconductor material without requiring additional process steps.

The method may further comprise attaching electrical connectors to the semiconductor-superconductor hybrid device. The electrical contacts may be configured to behave as normal conductors during operation of the device. For example, the electrical connectors may comprise a metal having a critical temperature lower than a critical temperature of the superconductor component. The electrical connectors may comprise a connector for the gate electrode, and one or more connectors for the semiconductor-superconductor hybrid structure. Precise alignment of the electrical connector for the gate electrode with the gate electrode is not required as long as the gate electrode and electrical connector are in electrical contact.

Another aspect provides the use of a semiconductor component as a gate electrode for gating a further semiconductor component in a semiconductor-superconductor hybrid device. As discussed above, using a semiconductor component as a gate electrode facilitates easier fabrication of the device.

For example, there is provided a method of operating a semiconductor-superconductor hybrid device, wherein the semiconductor-superconductor hybrid device comprises a substrate; a first semiconductor component arranged on the substrate; a superconductor component arranged to be capable of energy level hybridisation with the first semiconductor component; and a second semiconductor component arranged as a gate electrode for gating the first semiconductor component; which method comprises: cooling the semiconductor-superconductor hybrid device to a temperature at which the superconductor component becomes superconductive; applying a magnetic field to the semiconductor-superconductor hybrid device; and applying an electrostatic field to the first semiconductor component by supplying a charge to the second semiconductor component.

A still further aspect provides a semiconductor-superconductor hybrid device, comprising: a substrate; a semiconductor component arranged on the substrate; a gate electrode for gating the semiconductor component; and a superconductor component capable of undergoing energy level hybridisation with the semiconductor component; wherein the gate electrode is arranged in a channel in the substrate. By arranging the gate electrode in the channel, the substrate acts as a gate dielectric between the gate electrode and the semiconductor component. This may improve gating efficiency in comparison with side-gated devices which use a vacuum as the dielectric. In comparison with a top-gated device, leakage current may be reduced.

The gate electrode may fill the channel such that a top surface of the gate electrode and a top surface of the substrate together form a generally planar surface. Providing a planar surface, or in other words avoiding surface morphology, may be useful during manufacture. Avoiding surface morphology may make it easier to form further layers or components over the gate electrode. Illustrative examples of further layers and components include ohmic layers, superconductor layers, and gate lines.

The mask layer may extend over the gate electrode. Masks may be used during fabrication of the device, and may remain in the finished device.

Alternatively, a portion of the gate electrode may protrude above a top surface of the substrate. In such arrangements, the semiconductor-superconductor hybrid device may further comprise a mask layer, the mask layer being arranged on the substrate and surrounding the semiconductor component. In this configuration, the mask layer serves as part of the gate dielectric between the gate electrode and the semiconductor component.

The substrate may comprise a III-V semiconductor. The III-V semiconductor may, for example, be selected from indium phosphide, gallium arsenide, and gallium antimonide. These materials have relatively high permittivities.

Another aspect provides a method of fabricating a semiconductor-superconductor hybrid device on a substrate, which method comprises: etching the substrate selectively to form a channel in the substrate; forming a gate electrode in the channel; fabricating a semiconductor component on the substrate; and fabricating a superconductor component over at least a portion of the semiconductor component to form a semiconductor-superconductor hybrid structure. Since the position of the gate electrode may be determined by etching the channel, difficulties associated with aligning the gate electrode may be avoided.

The etching may be dry etching. Dry etching may allow for better resolution compared to wet etching. In wet etching processes, the etchant tends to underrun the edges of the mask resulting in relatively poorly-defined edges.

The etching may be performed before fabricating the semiconductor component. This may avoid exposing the semiconductor component to an etchant.

The gate electrode may be formed before or after fabricating the semiconductor component.

The method may further comprise, before fabricating the superconductor component, forming a shadow wall over the substrate. The shadow wall may be as described with reference to the first method of fabricating a semiconductor-superconductor hybrid device.

A still further aspect provides a method of fabricating a semiconductor-superconductor hybrid device, which method comprises: fabricating a gate electrode over a substrate; forming a dielectric mask over the substrate, the dielectric mask having an opening, which opening exposes a portion of the substrate; fabricating a semiconductor component on the portion of the substrate by selective area growth; and fabricating a superconductor component over the semiconductor component to form the semiconductor-superconductor hybrid device; wherein the gate electrode is fabricated before the semiconductor component; and wherein the gate electrode comprises a gate material selected to avoid interference with the selective area growth. It has surprisingly been found that not all gate materials will interfere with selective area growth process by fabricating the gate electrode from an appropriate material, it is possible to form the gate electrode before fabricating the semiconductor component.

Fabricating the gate electrode may comprise fabricating the gate electrode using a lift-off process. Lift-off processes may have better compatibility with materials such as refractory metals and platinum than processes which make use of etching.

The gate electrode may comprise a material having a melting point greater than or equal to 1500° C. For example, the gate electrode may comprise a material selected from platinum and a refractory metal.

As used herein, the term "refractory metal" refers to a refractory metal having a melting point greater than or equal to 1850° C. Examples of refractory metals are titanium, vanadium, chromium, manganese, zirconium, niobium, molybdenum, technetium, ruthenium, rhodium, hafnium, tantalum, tungsten, rhenium, osmium and iridium. In particular, the refractory metal may be selected from niobium, molybdenum, tantalum, tungsten and rhenium.

The refractory metal may be in the form of an alloy or compound. Examples of useful alloys and compounds include TiN, TiNb, and NbTiN.

Fabricating the gate electrode may include forming a tie layer of a first material, and then forming a layer of the gate material on the tie layer. The tie layer may improve the adhesion of the gate material to the substrate or dielectric mask, as appropriate. Examples of materials useful for forming the tie layer include titanium and tungsten. In particular, the first material may be titanium. For example, the first material may be titanium and the gate material may be platinum.

Forming the dielectric mask may include depositing a layer of a dielectric material using a technique selected from: plasma-enhanced chemical vapour deposition, physical vapour deposition, chemical vapour deposition, low-pressure chemical vapour deposition, inductively coupled plasma chemical vapour deposition, and atomic layer deposition. Since the dielectric mask is formed before fabricating the semiconductor component, techniques which involve subjecting the workpiece to elevated temperatures may be used without restriction. These techniques may allow a high-quality dielectric to be obtained.

The dielectric mask may be patterned by applying a resist (e.g., by spin coating), applying lithography to the resist to form a resist mask, selectively etching the dielectric material through the resist mask, and stripping the resist.

The material of the dielectric mask is typically a high-K dielectric. A high-K dielectric is one which has a higher dielectric constant than that of silicon dioxide. Examples of high-K dielectrics include aluminium oxide, hafnium oxide, and mixtures thereof. Alternatively, other dielectric materials such as a silicon oxide or silicon nitride may be used.

Forming the dielectric mask may comprise: before fabricating the gate electrode, forming a first dielectric layer on the substrate; after fabricating the gate electrode, forming a second dielectric layer over the first dielectric layer and the gate electrode; and etching the first and second dielectric layers selectively to form the opening.

In implementations where the dielectric mask is formed from a first dielectric layer and a second dielectric layer, the materials of the first and second dielectric layers may be the same or different. For example, the first dielectric layer may comprise a material selected from a silicon oxide and a silicon nitride, and the second dielectric layer may comprise a high-K dielectric.

The gate electrode may be fabricated after forming a dielectric layer. In implementations where the dielectric mask is formed from a first dielectric layer and a second dielectric layer, the gate electrode may be fabricated on the first dielectric layer.

Alternatively, fabricating the gate electrode includes selectively etching the first dielectric layer to expose a portion of the substrate, such that the first dielectric layer serves as a mask for controlling positioning of the gate electrode. This may be preferred in implementations where part of the semiconductor component is to overhang the gate electrode, because a gate electrode having a smaller height may be obtained.

The opening in the dielectric mask may be formed by wet etching. Since the dielectric mask is formed before fabricating the semiconductor component, wet etching may be used without risk of damage to the semiconductor component.

The substrate may include a channel or trench, and the gate electrode may be fabricated in the channel or trench. As previously described, this may allow the substrate to act as a gate dielectric, which may improve gating efficiency.

A further aspect provides a semiconductor-superconductor hybrid device, comprising: a substrate; a semiconductor component arranged on the substrate; a superconductor component arranged to be capable of energy level hybridisation with the semiconductor component; a gate electrode for gating the semiconductor component; and a gate dielectric arranged between the gate electrode and the semiconductor component. A bottom part of the gate electrode is spaced laterally from a bottom part of the semiconductor component. A top part of the semiconductor component overhangs at least a portion of the gate electrode. Since the semiconductor component overhangs the gate electrode, more effective gating may be made possible. The device has both side-gated and bottom-gated character.

Such a device may be obtained by a method of the previous aspect. The method involves a combination of lithographic processes and selective area growth.

In a lithography process, the exposure stage has a finite resolution. This constrains the minimum distance that can be defined between components. Etching processes, and in particular wet etching processes, will "over-etch" to some extent. In other words, some material beyond the edges of the exposed region is removed. Over-etching is usually regarded in the art as a drawback of etching processes.

In selective area growth processes using a mask, edges of the component grown may over-grow and extend past the edge of the opening in the mask. The inventors have found that the over-etching effect and over-growth effects can together be exploited to fabricate a structure in which part of the semiconductor component overhangs the gate electrode.

As will be appreciated, the features of the substrate, semiconductor component and superconductor component described above with reference to other device aspects are also applicable to the present aspect. For example, any of the previously-described substrate, semiconductor, and superconductor materials may be used.

The gate electrode may be arranged in a channel or trench in the substrate.

The features relating to the gate material and dielectric material discussed with reference to the preceding aspect are also equally applicable to the present aspect.

For example, the gate material may comprise a material having a melting point greater than or equal to 1500° C. During fabrication of the device, the gate electrode is fabricated before growing the semiconductor component.

Materials having melting points above 1500° C. may have good compatibility with processes such as selective area growth, since the material will not melt or diffuse under the relevant process conditions. In particular, the gate electrode may comprise a material selected from platinum and a refractory metal.

The gate dielectric may comprise a material obtainable by a technique selected from: plasma-enhanced chemical vapour deposition, physical vapour deposition, chemical vapour deposition, low-pressure chemical vapour deposition, inductively coupled plasma chemical vapour deposition, and atomic layer deposition. These techniques may allow high-quality dielectrics to be obtained.

EXAMPLES

Comparative Example—Fabrication of the FIG. 1 Device

A device of the type illustrated in FIG. 1 is fabricated as follows:
1) A silicon nitrite, $SiN_x$, mask having a thickness in the range 15 to 20 nm is formed on an indium phosphide wafer using plasma enhanced chemical vapour deposition, PECVD.
2) Molecular beam epitaxy is used to perform selective area growth of a semiconductor component on the substrate. The semiconductor component comprises indium antimonide or indium arsenide, and is in the form of a nanowire.
3) A superconductor component is deposited on a portion of the semiconductor component using molecular beam epitaxy, thereby forming a semiconductor-superconductor hybrid structure.
4) Gold electrical contacts are formed at respective ends of the nanowire.
5) A dielectric layer comprising silicon nitride is applied over the resulting workpiece by sputtering.
6) A gate electrode is fabricated over the nanowire, by depositing gold.

Example 1—Fabrication of the FIG. 3 Device

An illustrative method of fabricating the side-gated device of the type shown in FIG. 3 is as follows:
1) A silicon nitrite, $SiN_x$, mask having a thickness in the range 15 to 20 nm is formed on an indium phosphide wafer using plasma enhanced chemical vapour deposition, PECVD.
2) Molecular beam epitaxy is used to perform selective area growth of a first semiconductor component and a second semiconductor component on the substrate. The first semiconductor component is in the form of a nanowire. The second semiconductor component is for use as a gate electrode, and is spaced laterally from the first semiconductor component.
3) A superconductor component is selectively deposited on a portion of the first semiconductor component using molecular beam epitaxy, thereby forming a semiconductor-superconductor hybrid structure.
4) Gold electrical connectors are formed at respective ends of the nanowire. At the same time an electrical connector in contact with the second semiconductor component is formed.
5) Optionally, a dielectric layer comprising silicon nitride may be applied over the device by sputtering.

Figure 12:
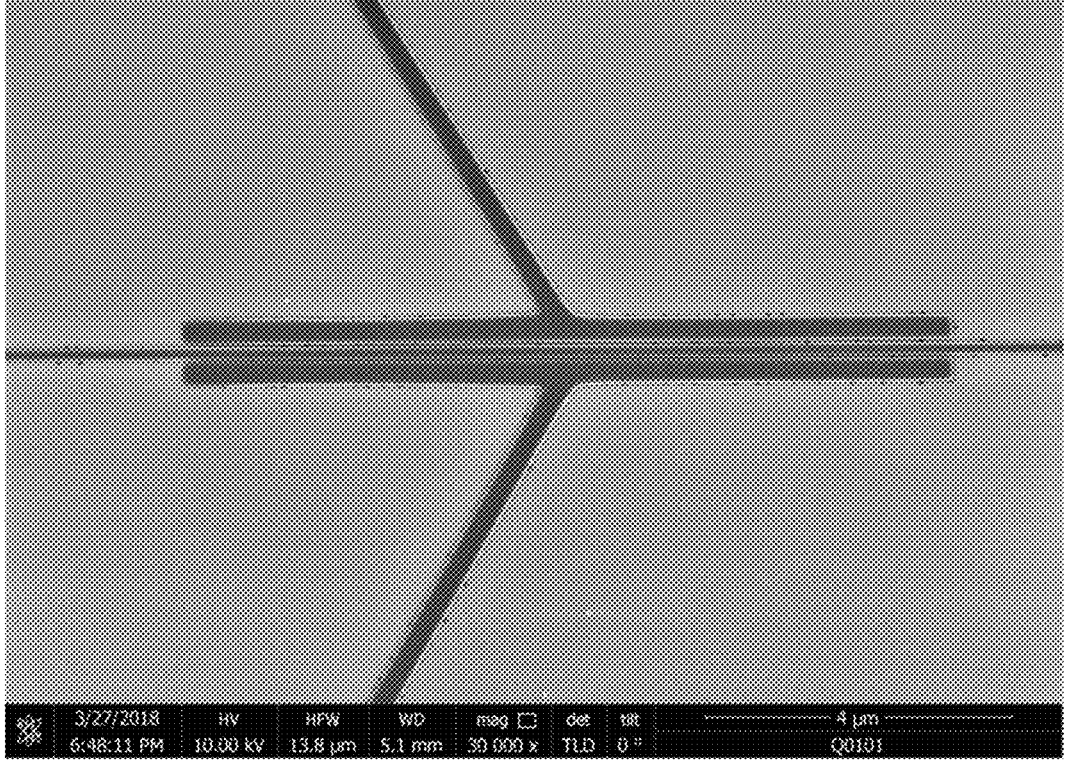
FIG. 12 is a scanning electron microscopy, SEM, micrograph of a device fabricated in accordance with Example 1.

As will be appreciated, step 6) of the method of the comparative example is eliminated, and step 5) is made optional. A scanning electron microscopy, SEM, micrograph showing a device fabricated in accordance with this method is shown in FIG. 12. The micrograph shows a nanowire, which extends from left to right, and two selective-area-grown gate electrodes (top and bottom of the image).

Example 2—Electrostatic Potentials in Various Side-Gated Devices

In order to illustrate the effects of embedding the gate electrode in the substrate, electric field strengths in three different devices were simulated. Results of these simulations are shown in FIGS. 9*a* to 9*c*.

In each of the simulations, the electrical potential at the gate electrode was set to 1 V, and the superconductor was set as ground.

Figure 9A:
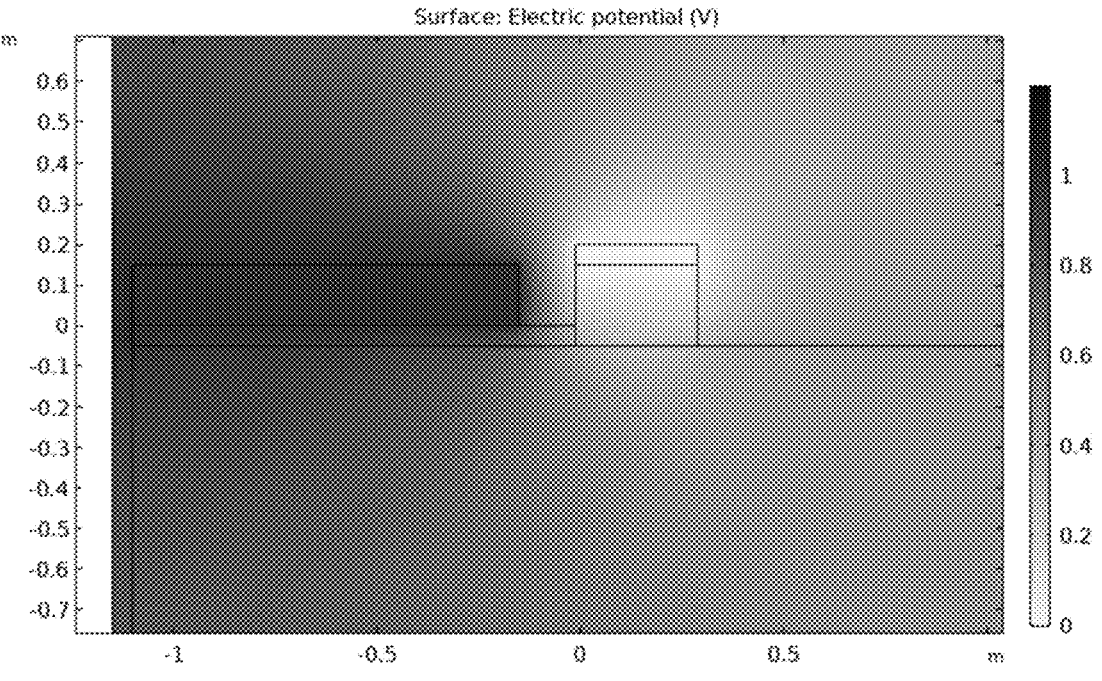
Figure 9B:
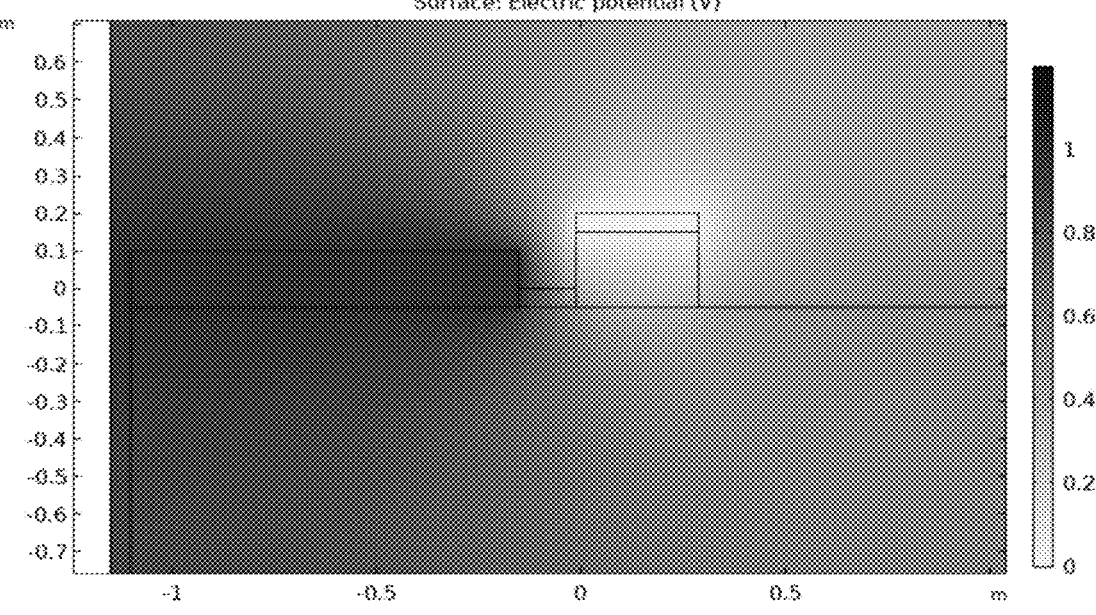

FIG. 9*a* is a heat map showing electrical potential as a function of position in a comparative side-gated device. In this device, the gate electrode is arranged on top of a silicon oxide, $SiO_x$, mask and an empty space serves as the gate dielectric.

The electrical potential at a bottom corner of the nanowire adjacent to the gate electrode was calculated to be 0.32 V, and the electrical potential towards the middle of the base of the nanowire was calculated to be 0.225 V.

FIG. 9*b* is a heat map showing electrical potentials for a second comparative side-gated device, in which the gate electrode is arranged directly on a surface of the substrate, with the silicon oxide mask layer being arranged between the gate electrode and the hybrid structure.

The electrical potential at the corner of the nanowire increases to 0.36 V, and the potential at the base of the nanowire increases to 0.255 V. This illustrates that using a dielectric mask as part of the gate dielectric between the gate electrode and the semiconductor-superconductor hybrid structure increases gating efficiency.

FIG. 9*c* shows results for a device having a gate electrode embedded in the substrate. A further increase in the potential observed at the corner of the nanowire to 0.41 V is observed. Potential at the bottom of the nanowire increases to 0.28 V. This corresponds to an improvement of approximately 30% in comparison with the FIG. 9*a* case.

The present disclosure provides the following clauses:

Clause 1. A semiconductor-superconductor hybrid device comprising:

a substrate;

a first semiconductor component arranged on the substrate;

a superconductor component arranged to be capable of energy level hybridisation with the first semiconductor component; and a second semiconductor component arranged as a gate electrode for gating the first semiconductor component.

Clause 2. The semiconductor-superconductor hybrid device according to Clause 1, further comprising a channel formed in the substrate, and wherein at least a portion of the second semiconductor component is arranged in the channel.

Clause 3. The semiconductor-superconductor hybrid device according to Clause 1 or Clause 2, further comprising a dielectric mask arranged on the substrate, wherein at least a portion of the dielectric mask is arranged between the first semiconductor component and the second semiconductor component.

Clause 4. The semiconductor superconductor hybrid device according to any of Clauses 1 to 3, further comprising a layer of dielectric over the first semiconductor component, the second semiconductor component, and the superconductor component.

Clause 5. A method of fabricating a semiconductor-superconductor hybrid device, which method comprises:

forming a mask on a substrate, the mask defining respective areas for a first semiconductor component and a second semiconductor component;

growing the first semiconductor component and the second semiconductor component simultaneously in the respective areas; and forming a semiconductor-superconductor hybrid structure by forming a superconductor component selectively over at least a portion of the first semiconductor component;

wherein the respective areas are selected such that the second semiconductor component is arranged as a gate electrode for gating the first semiconductor component.

Clause 6. The method according to Clause 5, wherein forming the mask includes forming a dielectric layer by a method selected from: baking a resist at a temperature greater than or equal to 200° C., plasma-enhanced chemical vapour deposition, physical vapour deposition, chemical vapour deposition, low-pressure chemical vapour deposition, inductively coupled plasma chemical vapour deposition, and atomic layer deposition;

and then etching the dielectric layer to form a mask.

Clause 7. The method according to Clause 5 or Clause 6, wherein the method further comprises, before the depositing, forming a shadow wall over the substrate; and wherein depositing the superconductor component comprises directionally depositing superconductor material from a direction selected such that the shadow wall defines a shadow region in which the superconductor material is not deposited.

Clause 8. The method according to Clause 7, wherein the shadow wall is formed before the growing.

Clause 9. Use of a semiconductor component as a gate electrode for gating a further semiconductor component in a semiconductor-superconductor hybrid device.

Clause 10. A semiconductor-superconductor hybrid device, comprising:

a substrate;

a semiconductor component arranged on the substrate;

a gate electrode for gating the semiconductor component; and a superconductor component capable of undergoing energy level hybridisation with the semiconductor component;

wherein the gate electrode is arranged in a channel in the substrate.

Clause 11. The semiconductor-superconductor hybrid device according to Clause 10, wherein the gate electrode fills the channel such that a top surface of the gate electrode and a top surface of the substrate together form a generally planar surface.

Clause 12. The semiconductor-superconductor hybrid device according to Clause 10 or Clause 11, further comprising a mask layer, wherein the mask layer is arranged on the substrate and surrounds the semiconductor component.

Clause 13. The semiconductor-superconductor hybrid device according to Clause 11, wherein the mask layer extends over the gate electrode.

Clause 14. The semiconductor-superconductor hybrid device according to any of Clauses 10 to 13, wherein the substrate comprises a III-V semiconductor.

Clause 15. A method of fabricating a semiconductor-super-conductor hybrid device on a substrate, which method comprises:

etching the substrate to form a channel in the substrate;

forming a gate electrode in the channel;

fabricating a semiconductor component on the substrate; and fabricating a superconductor component over at least a portion of the semiconductor component to form the semiconductor-superconductor hybrid device.

Clause 16. The method according to Clause 15, wherein the etching is dry etching.

Clause 17. The method according to Clause 15 or Clause 16, wherein the etching is performed before fabricating the semiconductor component.

Clause 18. A method of fabricating a semiconductor-super-conductor hybrid device, which method comprises:

fabricating a gate electrode over a substrate;

forming a dielectric mask over the substrate, the dielectric mask having an opening, which opening exposes a portion of the substrate;

fabricating a semiconductor component on the portion of the substrate by selective area growth; and fabricating a superconductor component over the semi-conductor component to form the semiconductor-su-perconductor hybrid device;

wherein the gate electrode is fabricated before the semi-conductor component; and wherein the gate electrode comprises a gate material selected to avoid interference with the selective area growth.

Clause 19. The method according to Clause 18, wherein the gate electrode is fabricated using a lift-off process.

Clause 20. The method according to Clause 18 or Clause 19, wherein the gate material comprises a material having a melting point greater than or equal to 1500° C.

Clause 21. The method according to Clause 20, wherein the gate material comprises a material selected from platinum and a refractory metal.

Clause 22. The method according to any of Clauses 18 to 21, wherein fabricating the gate electrode includes forming a tie layer of a first material, and then forming a layer of the gate material on the tie layer.

Clause 23. The method according to Clause 22, wherein the first material is selected from titanium and tungsten.

Clause 24. The method according to any of Clauses 18 to 23, wherein forming the dielectric mask comprises:

before fabricating the gate electrode, forming a first dielectric layer on the substrate;

after fabricating the gate electrode, forming a second dielectric layer over the first dielectric layer and the gate electrode; and etching the first and second dielectric layers selectively to form the opening.

Clause 25. The method according to Clause 24, wherein the gate electrode is fabricated on the first dielectric layer.

Clause 26. The method according to Clause 24, wherein fabricating the gate electrode includes selectively etching the first dielectric layer to expose a portion of the substrate, such that the first dielectric layer serves as a mask for controlling positioning of the gate electrode.

Clause 27. The method according to any of Clauses 18 to 26, wherein the opening in the dielectric mask is formed by wet etching.

Clause 28. The method according to any of Clauses 18 to 27, wherein the opening in the dielectric mask is spaced from the gate electrode by a distance selected such that, after the selective area growth, an upper part of the semiconductor component overhangs an upper part of the gate electrode and the semiconductor component is separated from the gate electrode by the dielectric mask.

Clause 29. A semiconductor-superconductor hybrid device, comprising:

a substrate;

a semiconductor component arranged on the substrate;

a superconductor component arranged to be capable of energy level hybridisation with the semiconductor component;

a gate electrode for gating the semiconductor component; and a gate dielectric arranged between the gate electrode and the semiconductor component;

wherein a bottom part of the gate electrode is spaced laterally from a bottom part of the semiconductor component; and wherein a top part of the semiconductor component overhangs at least a portion of the gate electrode.

Clause 30. The method according to Clause 29, wherein the gate material comprises a material having a melting point greater than or equal to 1500° C.

Clause 31. The semiconductor-superconductor hybrid device according to Clause 30, wherein the gate electrode comprises a material selected from platinum and a refractory metal.

Clause 32. The semiconductor-superconductor hybrid device according to any of Clauses 29 to 31, wherein the gate dielectric comprises a material obtainable by a tech-nique selected from: plasma-enhanced chemical vapour deposition, physical vapour deposition, chemical vapour deposition, low-pressure chemical vapour deposition, induc-tively coupled plasma chemical vapour deposition, and atomic layer deposition.

Clause 33. The semiconductor-superconductor hybrid device according to any of Clauses 29 to 32, wherein the gate electrode is arranged in a channel in the substrate.

Other variants or use cases of the disclosed techniques may become apparent to the person skilled in the art once given the disclosure herein. The scope of the disclosure is not limited by the described embodiments but only by the accompanying claims.

The invention claimed is:

1. A semiconductor-superconductor hybrid device com-prising:

a substrate;

a first semiconductor component arranged on the sub-strate;

a superconductor component arranged to be capable of energy level hybridisation with the first semiconductor component; and a second semiconductor component arranged as a gate electrode for gating the first semiconductor component, wherein the first and second semiconductor compo-nents comprise a material of Formula 1:

$$InAs_xSb_{1-x} \quad \text{(Formula 1)}$$

where x is in the range 0 to 1.

2. The semiconductor-superconductor hybrid device according to claim 1, further comprising:

a channel formed in the substrate, wherein at least a portion of the second semiconductor component is arranged in the channel.

3. The semiconductor-superconductor hybrid device according to claim 1, further comprising a dielectric mask arranged on the substrate, wherein at least a portion of the dielectric mask is arranged between the first semiconductor component and the second semiconductor component.

4. The semiconductor-superconductor hybrid device according to claim 1, wherein the superconductor component comprises aluminium.

5. The semiconductor-superconductor hybrid device according to claim 1, wherein the semiconductor-superconductor hybrid device comprises a pair of second semiconductor components arranged as gate electrodes.

6. The semiconductor-superconductor hybrid device according to claim 1, wherein the second semiconductor component is spaced laterally form the first semiconductor component by a distance of at least 50 nm.

7. A method of fabricating a semiconductor-superconductor hybrid device, which method comprises:

forming a mask on a substrate, the mask defining respective areas for a first semiconductor component and a second semiconductor component;

forming a shadow wall over the substrate;

growing the first semiconductor component and the second semiconductor component simultaneously in the respective areas at least in part by directionally depositing superconductor material from a direction selected such that the shadow wall defines a shadow region in which the superconductor material is not deposited; and forming a semiconductor-superconductor hybrid structure by forming a superconductor component selectively over at least a portion of the first semiconductor component;

wherein the respective areas are selected such that the second semiconductor component is arranged as a gate electrode for gating the first semiconductor component.

8. The method according to claim 7, wherein forming the mask includes:

forming a dielectric layer by a method selected from: plasma-enhanced chemical vapour deposition, physical vapour deposition, chemical vapour deposition, low-pressure chemical vapour deposition, inductively coupled plasma chemical vapour deposition, and atomic layer deposition; and etching the dielectric layer to form the mask.

9. The method according to claim 7, wherein the shadow wall is formed before the growing.

10. The method according to claim 7, further comprising attaching electrical connectors to the semiconductor-superconductor hybrid device.

11. A semiconductor-superconductor hybrid device, comprising:

a substrate;

a semiconductor component arranged on the substrate;

a gate electrode for gating the semiconductor component; and a superconductor component capable of undergoing energy level hybridisation with the semiconductor component; and a mask layer, wherein the mask layer is arranged on the substrate and surrounds the semiconductor component, wherein the gate electrode is arranged in a channel in the substrate.

12. The semiconductor-superconductor hybrid device according to claim 11, wherein the gate electrode fills the channel such that a top surface of the gate electrode and a top surface of the substrate together form a generally planar surface.

13. The semiconductor-superconductor hybrid device according to claim 11, wherein the substrate comprises a III-V semiconductor.

14. The semiconductor-superconductor hybrid device according to claim 11, wherein the mask layer extends over the gate electrode.

15. The semiconductor-superconductor hybrid device according to claim 11, wherein the semiconductor components comprise a material of Formula 1:

$$InAs_xSb_{1-x} \qquad \text{(Formula 1)}$$

where x is in the range 0 to 1.

16. The semiconductor-superconductor hybrid device according to claim 11, wherein the superconductor component comprises aluminium.

17. The semiconductor-superconductor hybrid device according to claim 11, wherein the gate electrode comprises a material having a melting point greater than or equal to 1500° C.

18. The semiconductor-superconductor hybrid device according to claim 17, wherein the gate electrode comprises a material selected from platinum and a refractory metal.

* * * * *